(12) United States Patent
Walker

(10) Patent No.: US 7,953,573 B2
(45) Date of Patent: May 31, 2011

(54) SEMICONDUCTOR DEVICE HAVING VARIABLE PARAMETER SELECTION BASED ON TEMPERATURE AND TEST METHOD

(75) Inventor: Darryl G. Walker, San Jose, CA (US)

(73) Assignee: Agersonn Rall Group, L.L.C., Dover, DE (US)

( * ) Notice: Subject to any disclaimer, the term of this patent is extended or adjusted under 35 U.S.C. 154(b) by 0 days.

(21) Appl. No.: 12/753,411

(22) Filed: Apr. 2, 2010

(65) Prior Publication Data

US 2011/0044119 A1 Feb. 24, 2011

Related U.S. Application Data

(62) Division of application No. 12/150,091, filed on Apr. 24, 2008, now Pat. No. 7,720,627, which is a division of application No. 11/637,280, filed on Dec. 12, 2006, now Pat. No. 7,383,149.

(60) Provisional application No. 60/793,220, filed on Apr. 19, 2006.

(51) Int. Cl.
*G01K 1/02* (2006.01)
*G01K 1/08* (2006.01)

(52) U.S. Cl. ........ 702/130; 327/512; 365/211; 365/222; 365/189.09; 374/176; 702/132

(58) Field of Classification Search .................. 702/42, 702/107, 130, 132, 136; 365/189.09, 211, 365/212, 222; 324/207.12; 327/512; 374/176, 374/185

See application file for complete search history.

(56) References Cited

U.S. PATENT DOCUMENTS

| | | | |
|---|---|---|---|
| 3,450,867 | A | 6/1969 | Blum et al. |
| 3,459,925 | A | 8/1969 | Goosey et al. |
| 3,573,776 | A | 4/1971 | Dick et al. |
| 3,903,395 | A | 9/1975 | Hamstra |
| 4,493,981 | A | 1/1985 | Payne |
| 4,502,043 | A | 2/1985 | Moore |
| 4,564,748 | A | 1/1986 | Gupton |
| 5,111,691 | A | 5/1992 | John et al. |
| 5,278,796 | A | 1/1994 | Tillinghast et al. |
| 5,303,160 | A | 4/1994 | Winter et al. |
| 5,742,177 | A | 4/1998 | Kalb, Jr. |

(Continued)

OTHER PUBLICATIONS

Ex Parte Quayle issued in U.S. Appl. No. 12/540,446 and mailed Nov. 26, 2010.

(Continued)

*Primary Examiner* — John H Le

(57) ABSTRACT

A semiconductor device that may include temperature sensing circuits is disclosed. The temperature sensing circuits may be used to control various parameters, such as internal regulated supply voltages, internal refresh frequency, or a word line low voltage. In this way, operating specifications of a semiconductor device at worst case temperatures may be met without compromising performance at normal operating temperatures. Each temperature sensing circuit may include a selectable temperature threshold value as well as a selectable temperature hysteresis value. In this way, temperature performance characteristics may be finely tuned. Furthermore, a method of testing the temperature sensing circuits is disclosed in which a current value may be monitored and temperature threshold values and temperature hysteresis values may be thereby determined.

31 Claims, 16 Drawing Sheets

U.S. PATENT DOCUMENTS

| | | | |
|---|---|---|---|
| 5,774,425 A | 6/1998 | Ivanov et al. | |
| 5,841,204 A | 11/1998 | English | |
| 5,875,142 A | 2/1999 | Chevallier | |
| 5,875,312 A | 2/1999 | Walsh et al. | |
| 5,931,011 A | 8/1999 | Shima et al. | |
| 5,956,289 A | 9/1999 | Norman et al. | |
| 6,002,627 A | 12/1999 | Chevallier | |
| 6,091,255 A | 7/2000 | Godfrey | |
| 6,150,872 A | 11/2000 | McNeill et al. | |
| 6,160,755 A | 12/2000 | Norman et al. | |
| 6,363,490 B1 | 3/2002 | Senyk | |
| 6,438,057 B1 | 8/2002 | Ruckerbauer | |
| 6,442,500 B1 | 8/2002 | Kim | |
| 6,549,065 B2 | 4/2003 | Opris | |
| 6,567,763 B1 | 5/2003 | Javanifard et al. | |
| 6,587,763 B2 | 7/2003 | Ishikawa | |
| 6,674,623 B1 | 1/2004 | Abe et al. | |
| 6,678,185 B1 | 1/2004 | Cleary | |
| 6,717,530 B1 | 4/2004 | Schmidt et al. | |
| 6,847,911 B2 | 1/2005 | Huckaby et al. | |
| 6,937,087 B2 * | 8/2005 | Sim et al. | 327/512 |
| 6,985,000 B2 | 1/2006 | Feder et al. | |
| 7,035,157 B2 | 4/2006 | Chang | |
| 7,078,955 B2 | 7/2006 | Kim et al. | |
| 7,107,178 B2 | 9/2006 | Won et al. | |
| 7,158,911 B2 | 1/2007 | Gunther et al. | |
| 7,177,218 B2 | 2/2007 | Choi et al. | |
| 7,193,917 B2 | 3/2007 | Takahashi et al. | |
| 7,216,064 B1 | 5/2007 | Pippin | |
| 7,248,527 B2 | 7/2007 | Park | |
| 7,376,532 B2 | 5/2008 | Johns et al. | |
| 7,383,149 B1 | 6/2008 | Walker | |
| 7,423,473 B2 | 9/2008 | Kim | |
| 7,460,394 B2 | 12/2008 | Happ et al. | |
| 7,480,588 B1 | 1/2009 | Walker | |
| 7,535,786 B1 | 5/2009 | Walker | |
| 7,553,077 B2 | 6/2009 | Schubring et al. | |
| 7,583,553 B2 * | 9/2009 | Mori | 365/222 |
| 7,603,249 B1 | 10/2009 | Walker et al. | |
| 7,639,548 B1 | 12/2009 | Walker | |
| 7,654,736 B1 | 2/2010 | Walker | |
| 7,720,627 B1 | 5/2010 | Walker | |
| 7,760,570 B1 | 7/2010 | Walker | |
| 2004/0024561 A1 | 2/2004 | Huckaby et al. | |
| 2004/0071191 A1 | 4/2004 | Sim et al. | |
| 2005/0052923 A1 | 3/2005 | Uchikoba et al. | |
| 2005/0141311 A1 | 6/2005 | Kim et al. | |
| 2005/0146965 A1 | 7/2005 | Kim et al. | |
| 2005/0276139 A1 | 12/2005 | Choi et al. | |
| 2005/0276144 A1 | 12/2005 | Min et al. | |
| 2006/0023546 A1 | 2/2006 | Park | |
| 2006/0028890 A1 | 2/2006 | Lee et al. | |
| 2006/0267668 A1 | 11/2006 | Porter | |
| 2006/0285408 A1 | 12/2006 | Betser et al. | |
| 2007/0008798 A1 | 1/2007 | Hokenmaier et al. | |
| 2007/0036015 A1 | 2/2007 | Sako | |
| 2007/0098041 A1 | 5/2007 | Seo | |
| 2007/0160113 A1 | 7/2007 | Kim et al. | |
| 2008/0018482 A1 | 1/2008 | Chiu et al. | |
| 2008/0043556 A1 | 2/2008 | Nale | |
| 2009/0196326 A1 | 8/2009 | Tsukude | |

OTHER PUBLICATIONS

Non-final Office Action issued in U.S. Appl. No. 11/708,174 and mailed on Sep. 21, 2010.
Restriction Requirement issued in U.S. Appl. No. 12/635,533 and mailed Dec. 10, 2010.
U.S. Appl. No. 11/637,280, filed May 15, 2008, Walker.
U.S. Appl. No. 11/708,174, filed Feb. 20, 2007, Walker.
U.S. Appl. No. 11/708,184, filed Feb. 20, 2007, Walker.
U.S. Appl. No. 60/793,220, filed Apr. 19, 2006, Walker.
Non-final Office Action issued in U.S. Appl. No. 12/635,533 and mailed on Jan. 18, 2011.
Final Office Action issued in U.S. Appl. No. 11/708,174 and mailed Apr. 6, 2011.

* cited by examiner

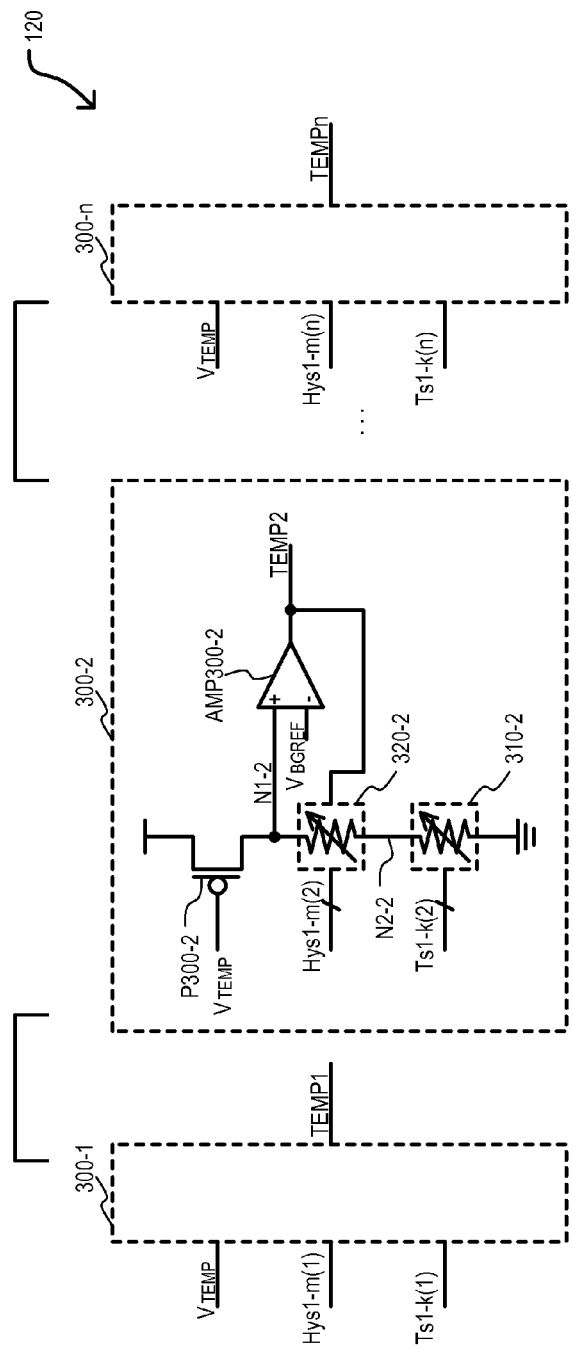
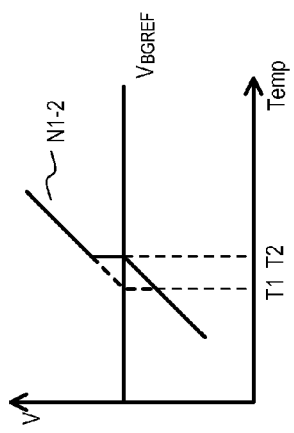
FIG. 3(a)
FIG. 3(b)

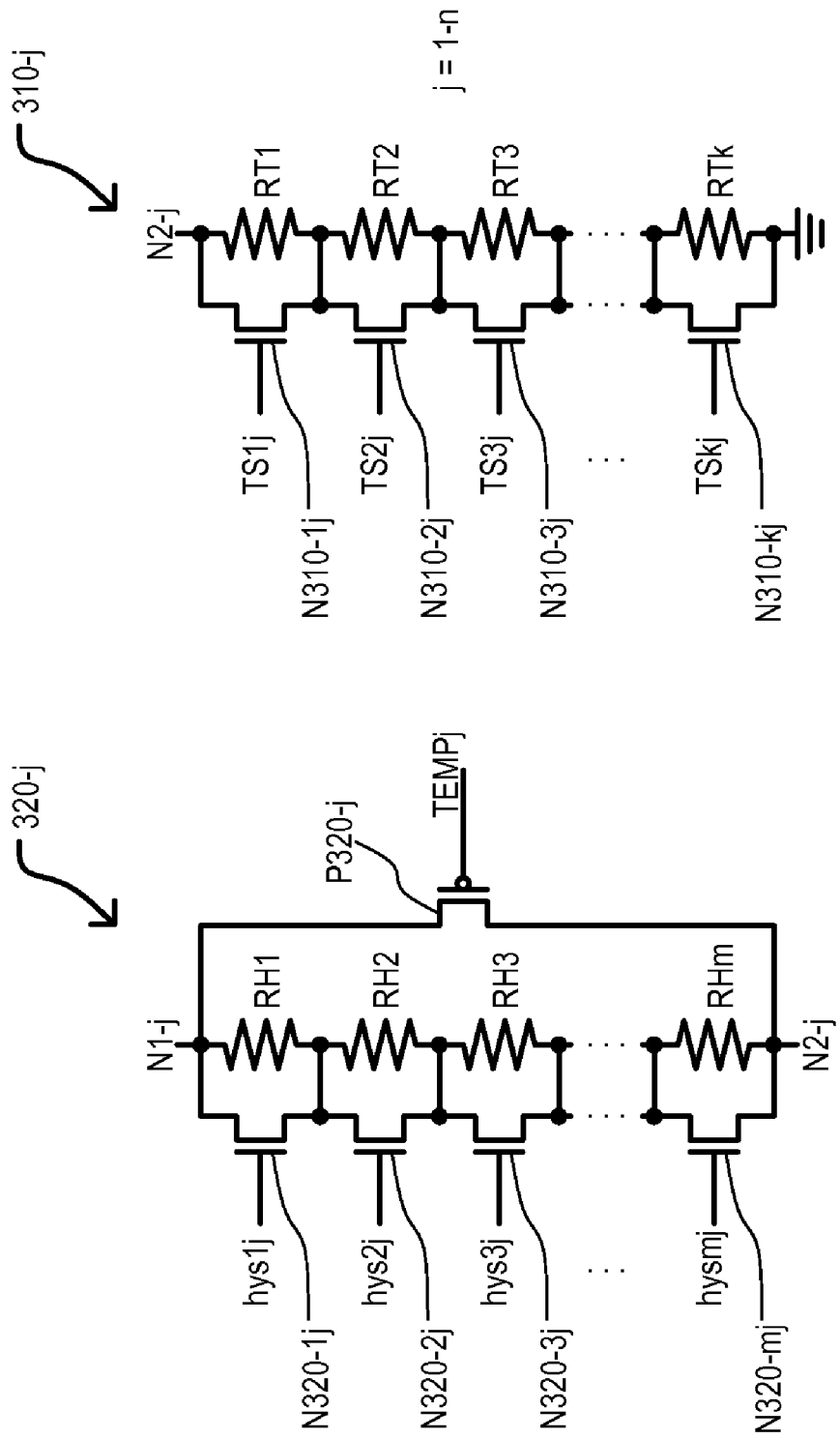

SEMICONDUCTOR DEVICE HAVING VARIABLE PARAMETER SELECTION BASED ON TEMPERATURE AND TEST METHOD

This application is a divisional of patent application Ser. No. 12/150,091, filed Apr. 24, 2008, which is a divisional of Ser. No. 11/637,280 now U.S. Pat. No. 7,383,149 filed Dec. 12, 2006, which claims the benefit of now expired provisional application Ser. No. 60/793,220 filed Apr. 19, 2006, the contents of which are incorporated herein by reference.

TECHNICAL FIELD

The present invention relates generally to a semiconductor device, and more particularly to a semiconductor device including temperature sensing circuits that provide operating parameter selection.

BACKGROUND OF THE INVENTION

Semiconductor devices include components that have characteristics that vary with respect to temperature. For example, as temperature increases mobility of charge carriers decrease causing transistors, such as insulated gate field effect transistors (IGFET) to have lower drive current. Although drive current decreases, leakage current (leakage current when the IGFET is turned off) increases. These temperature dependent characteristics can make design problematic.

Typically when designing a semiconductor device, the designer will design circuit timing and internally regulated power supply voltages for worst case corners. Typically, a fast corner may be high voltage, low temperature and a slow corner may be low voltage and high temperature. By designing circuits in a semiconductor device for a worst case temperature, power may be unnecessarily wasted at another temperature point. For example, a power supply may provide a voltage that is unnecessarily high at a first temperature point due to the necessity of ensuring specifications are met at a second temperature point, even though the semiconductor device rarely operates at the second temperature point. This can cause power to be wasted at the first temperature point, which is where the semiconductor device typically operates.

A specific example is an internal refresh operation in a dynamic random access memory (DRAM). At a low temperature, charge on a DRAM capacitor in a DRAM memory cell may degrade more slowly than at high temperature. However, to ensure specifications are met, the frequency of refresh operations may be unnecessarily high at low temperatures to ensure the high temperature case is met. This can cause unnecessary power consumption in typical operating temperatures.

Unnecessary power consumption is even more important in mobile devices as it reduces battery lifetime.

In light of the above, it would be desirable to provide a semiconductor device in which parameters may be varied with respect to operating temperature. In addition, it would be desirable to provide a method of testing the temperatures at which parameters are varied.

BRIEF DESCRIPTION OF THE DRAWINGS

FIG. 3(a) is a circuit schematic diagram of temperature sensing circuits according to an embodiment.

FIG. 3(b) is a graph illustrating voltage-temperature characteristics of a temperature sensing circuit according to an embodiment.

FIG. 4 is a circuit schematic diagram of a variable resistor according to an embodiment.

FIG. 5 is a circuit schematic diagram of a variable resistor according to an embodiment.

DETAILED DESCRIPTION OF THE EMBODIMENTS

According to the embodiments set forth below, a semiconductor device can include a plurality of temperature sensing circuits. The temperature sensing circuits can include a temperature sensing selection and a hysteresis level selection. In this way, the temperature at which a specific sensing circuit provides a sensed output (i.e., the temperature sensing circuit's threshold level) is based on a temperature that can be selected by a user, as just one example. Furthermore, a user may select a hysteresis level, such that the sensed temperature output may remain until the temperature drops by a certain amount. By doing so, circuits controlled by the temperature sensing circuits may not have parameters continuously modified when a temperature hovers around a predetermined level in which the temperature sensing circuit's threshold has been set.

Figure 1:
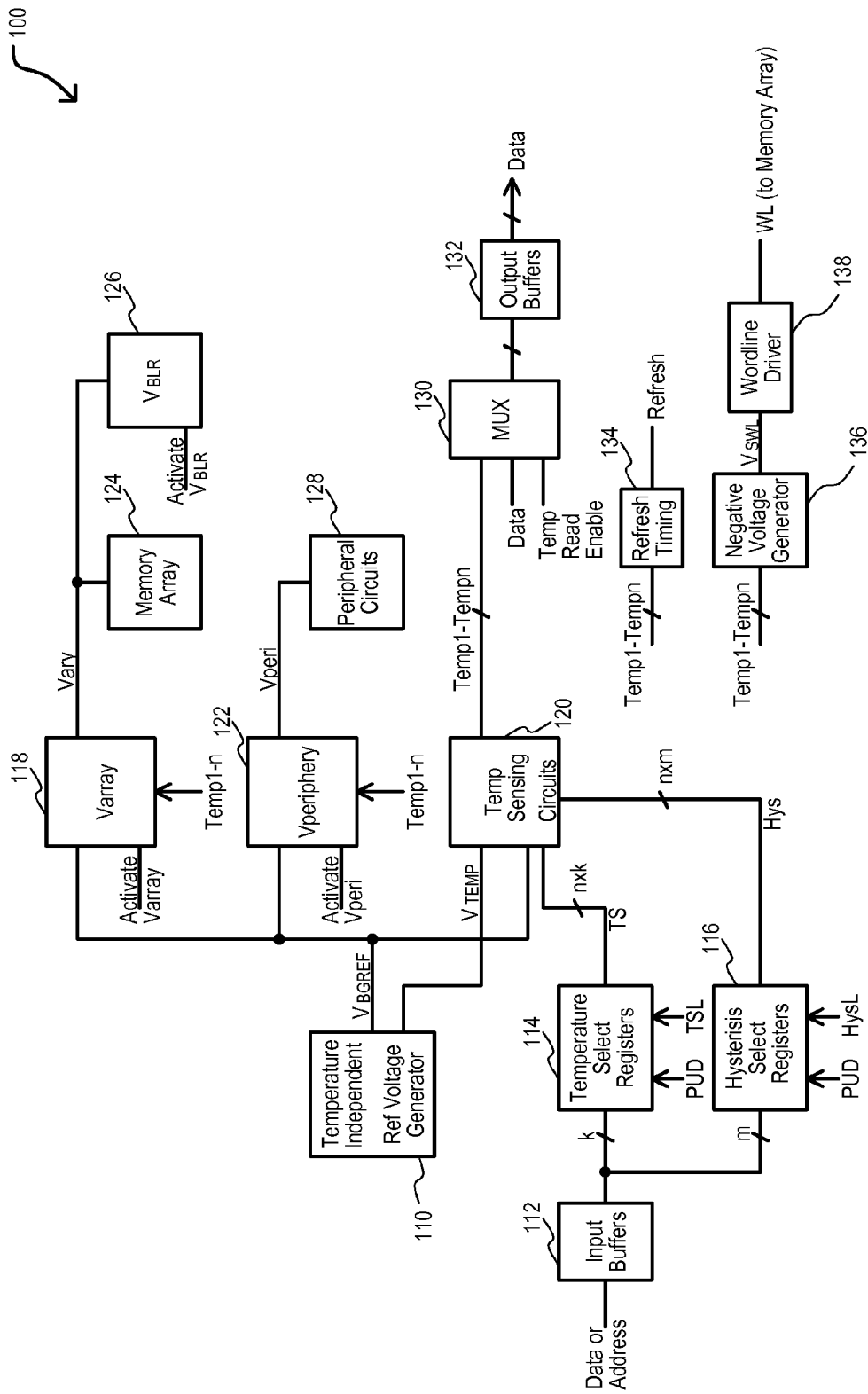
FIG. 1 is a block schematic diagram of a semiconductor device according to an embodiment.

Referring now to FIG. 1, a semiconductor device according to an embodiment is set forth in a block schematic diagram and given the general reference character 100. Semiconductor device 100 may be a semiconductor memory device. In the embodiment of FIG. 1, semiconductor device 100 is a Dynamic Random Access Memory (DRAM).

Semiconductor device 100 may include a temperature independent reference voltage generator 110 and temperature sensing circuits 120. Semiconductor device 100 may also include input buffers 112, temperature select registers 114, hysteresis select registers 116, array voltage generator 118, periphery voltage generator 122, a memory array 124, a bit line reference generator 126, a multiplexer 130, output buffers 132, a refresh timing circuit 134, a negative voltage generator 136, and a word line driver 138. It is understood that semiconductor device may include many other circuits, however to avoid unduly cluttering the FIG. 1, these circuits may be omitted.

Temperature independent voltage generator 110 may provide a voltage $V_{BGREF}$ and a voltage $V_{TEMP}$. Voltage $V_{BGREF}$ may be a reference voltage that is essentially independent of temperature. Voltage $V_{BGREF}$ may be provided as a reference voltage to temperature sensing circuits 120, array voltage generator 118, and periphery voltage generator 122. Input buffers 112 may receive a data DATA, address ADDRESS [or control CTRL] or some combination thereof as an input to be used as temperature select parameters and hysteresis select parameters for temperature sensing circuits 120. The temperature select parameters may be stored in temperature select registers 114 and output as temperature select signals TS. The hysteresis select parameters may be stored in hysteresis select registers 116 and used to generate hysteresis select signals HYS.

Temperature sensing circuits 120 may receive a reference voltage $V_{TEMP}$, and temperature independent reference voltage $V_{BGREF}$, temperature select signals TS, and hysteresis select signals HYS and may provide "n" temperature indication signals Temp1 to Tempn. Each temperature indication signal (Temp1 to Tempn) may be activated at a temperature trip point (temperature threshold value) selected by values in temperature select registers 114. Once activated, each temperature indication signal (Temp1 to Tempn) may be deactivated when the temperature of the semiconductor device 100 drops a predetermined number of degrees (hysteresis temperature value) below the trip point based on values in hysteresis select registers 116.

Various circuits may receive temperature indication signals (Temp1 to Tempn). These circuits may include array voltage generator 118, periphery voltage generator 122, refresh timing circuit 134, and negative voltage generator 136. Temperature indication signals (Temp1 to Tempn) may also be provided to a multiplexer so that the value of the temperature indication signals (Temp1 to Tempn) may be output to data outputs Data via output buffers 132 to be read by a controller, a processor or the like.

Array voltage generator 118 may receive the temperature independent reference voltage $V_{BGREF}$, temperature indication signals (Temp1 to Tempn), and an activation signal Activate Varray and may provide an array voltage Vary. Array voltage Vary may be provided by multiplying temperature independent reference voltage $V_{BGREF}$ by a factor. The multiplication factor may be determined in accordance with the values of temperature indication signals (Temp1 to Tempn). In this way, an array voltage Vary may be set in accordance with an operating temperature so that temperature effects within the memory array may be compensated. Array voltage Vary may be provided to the memory array 124 and bit line reference voltage generator 126, as just two examples.

Periphery voltage generator 122 may receive the temperature independent reference voltage $V_{BGREF}$, temperature indication signals (Temp1 to Tempn), and an activation signal Activate Vperi and may provide a periphery voltage Vperi. Periphery voltage Vperi may be provided by multiplying temperature independent reference voltage $V_{BGREF}$ by a factor. The multiplication factor may be determined in accordance with the values of temperature indication signals (Temp1 to Tempn). In this way, a periphery voltage Vperi may be set in accordance with an operating temperature to compensate for temperature effects within the peripheral circuits 128, which receives the peripheral voltage Vperi.

Refresh timing circuit 134 may receive temperature indication signals (Temp1 to Tempn) and may provide a refresh signal Refresh during a refresh mode of operation at a frequency at least partially determined by at least one of the temperature indication signals (Temp1 to Tempn). By doing so, a refresh period may decrease as temperature increases to compensate for the increased rate of decay of data in a DRAM cell as temperature increases. Multiple temperature indication signals (Temp1 to Tempn) may be used to decrease the refresh period at a rate that proportionally matches the rate at which the decay of data in a DRAM cell increases with temperature.

Negative voltage generator 136 may also receive temperature indication signals (Temp1 to Tempn) and may provide a virtual ground voltage for the word line WL via the word line driver 138. In this way, the word line low voltage may decrease as temperature increases to compensate for leakage of a pass transistor (for example, pass transistor 910 of a DRAM cell of FIG. 9). For example, at lower temperatures the virtual ground level may be VSS (i.e. a ground level supplied from a source external to the semiconductor device 100). However, as the temperature increases to a level in which the pass transistor leakage degrades the data in the memory cell, the word line low level may become negative, so that the pass transistor may be better turned off and leakage current may be reduced. By doing so, refresh frequency may not need to be increased as much and/or the semiconductor device 100 may operate over an increased temperature range.

Temperature indication signals (Temp1 to Tempn) may be provided to a multiplexer 130 and during a temperature read mode, a temperature read enable signal Temp Read Enable may be activated and the temperature indication signals (Temp1 to Tempn) may be passed to the data output Data via output buffers 132. It should be noted that there may be more temperature indication signals (Temp1 to Tempn) than data outputs Data. For example, data output Data may include 8 output signals and there may be more temperature indication signals (Temp1 to Tempn). In this case, temperature indication signals may be serially output, as just one example. In another case, only selected temperature indication signals (Temp1 to Tempn) may be output. In this way, a controller, processor, or the like may be able to determine if the temperature of the semiconductor device 100 is within a certain wider temperature range as needed to control a cooling device such as a fan or the like.

By providing temperature indication signals (Temp1 to Tempn) externally to semiconductor device by way of data signals Data, a device test may be implemented. In a device test, a semiconductor device 100 may be evaluated over a temperature range and values may be entered into temperature select registers 114 to provide temperature select signals TS and values may be entered into hysteresis select registers 116 to provide hysteresis select signals HYS to calibrate the temperature sensing circuits.

Temperature select registers 114 and hysteresis select registers 116 may receive a power up detect signal PUD. In this way, temperature select signals TS and hysteresis select signals HYS may be set to a default state upon power up. A default state may be all zeroes or all ones, as but two examples.

During a temperature select register load operation, a temperature select load signal TSL may be activated and the values may be loaded into temperature select registers 114 from data or address pins by way of input buffers. Likewise, during a hysteresis select register load operation, a hysteresis select load signal HYSL may be activated and the values may be loaded into hysteresis select registers 116 from data or address pins by way of input buffers. It should be noted that there may be more temperature select registers 114 and/or hysteresis select registers 116 than address or data pins. In this case, the values may be serially loaded into temperature select registers 114 and/or hysteresis select registers 116, respectively.

Figure 2:
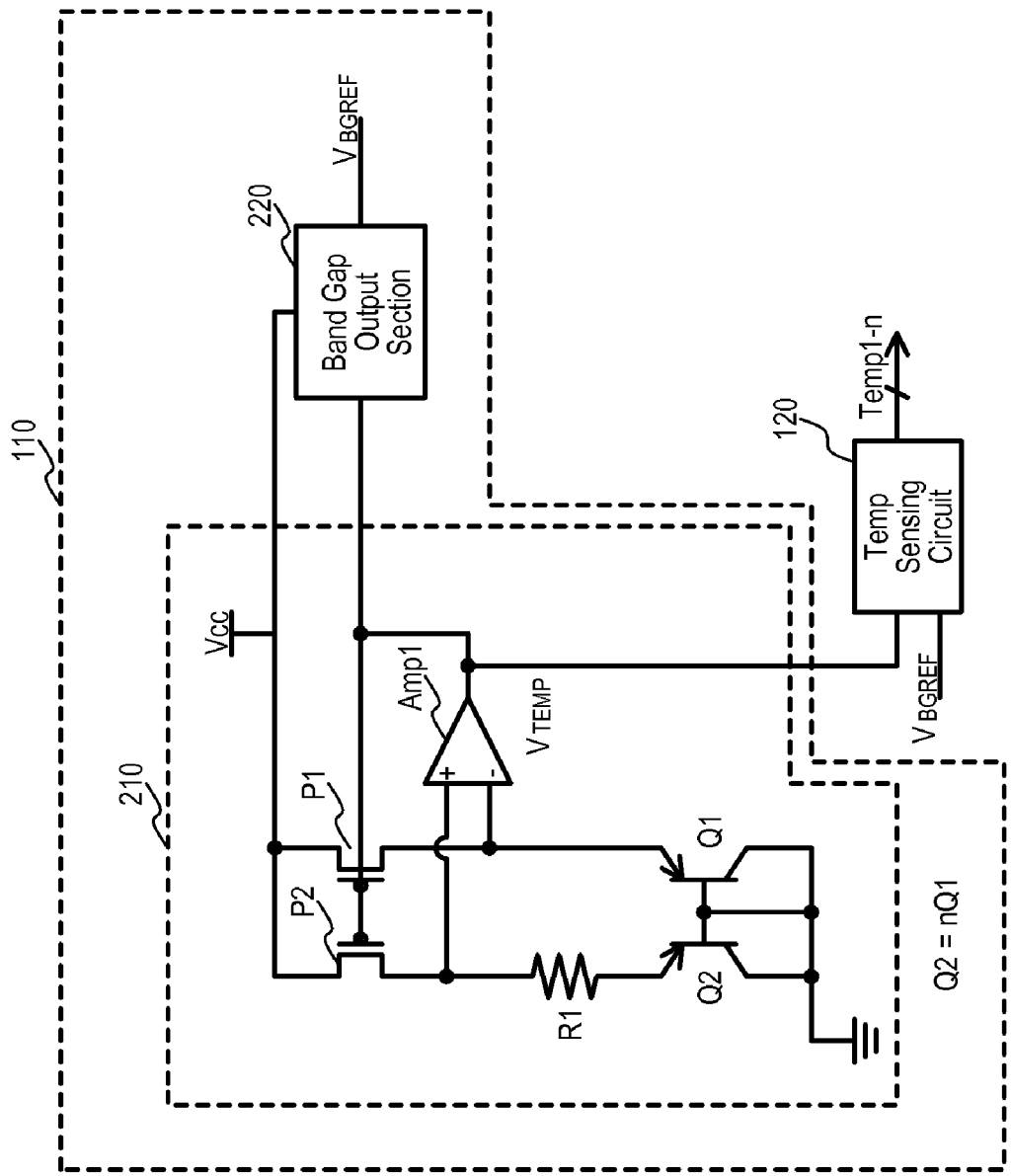
FIG. 2 is a circuit schematic diagram of a temperature independent reference voltage generator and temperature sensing circuit according to an embodiment.

Referring now to FIG. 2, temperature independent reference voltage generator 110 and temperature sensing circuit 120 according to an embodiment are set forth in a circuit schematic diagram.

Temperature independent reference voltage generator 110 may include a bandgap reference input section 210 and a bandgap reference output section 220. Bandgap reference input stage 210 may provide a voltage $V_{TEMP}$ to both temperature sensing circuit 120 and bandgap reference output section 220. Bandgap reference output section 220 may provide an essentially temperature independent reference voltage $V_{BGREF}$ to temperature sensing circuit 120. An example of a bandgap reference output section providing a temperature independent reference voltage can be seen in U.S. Pat. No. 6,150,872 incorporated herein by reference or U.S. Pat. No. 6,549,065 incorporated by reference, as just two examples.

Bandgap reference input section 210 may include bipolar transistors (Q1 and Q2), resistor R1, transistors (P1 and P2), and amplifier AMP1. Bipolar transistor Q1 may have an emitter commonly connected to a negative input of amplifier AMP1 and a drain of transistor P1. Bipolar transistor Q2 may have an emitter connected to a first terminal of resistor R1. Bipolar transistors (Q1 and Q2) may have bases and collectors commonly connected to a ground terminal. Alternatively, in some cases the bases and collectors may be connected to a negatively charged substrate voltage, as just one more example. Resistor R1 may have a second terminal commonly connected to a positive input of amplifier AMP1 and a drain of transistor P2. Amplifier AMP1 may provide voltage $V_{TEMP}$ as an output, which is also fed back to the gates of transistors (P1 and P2). Transistors (P1 and P2) may have sources connected to a power supply voltage Vcc.

Bipolar transistors (Q1 and Q2) may be substrate pnp bipolar transistors and transistor Q2 may be sized at nQ1. Transistors (P1 and P2) may be p-channel insulated gate field effect transistors (IGFET), such as MOSFETs.

The operation of bandgap reference input section 210 will be described later in conjunction with the temperature sensing circuit 120.

Referring now to FIG. 3(a), temperature sensing circuits 120 according to an embodiment are set forth in a circuit schematic diagram.

In FIG. 3(a), there are n temperature sensing circuits (300-1 to 300-n). Temperature sensing circuit 300-1 may receive voltage $V_{TEMP}$, hysteresis select signals HYS1-m(1), and temperature select signals TS1-k(1) and may provide a temperature indication signal TEMP1. Temperature sensing circuit 300-2 may receive voltage $V_{TEMP}$, hysteresis select signals HYS1-m(2), and temperature select signals TS1-k(2) and may provide a temperature indication signal TEMP2, and so on up to the nth temperature sensing circuit 300-n, which may receive voltage $V_{TEMP}$, hysteresis select signals HYS1-m(n), and temperature select signals TS1-k(n) and may provide a temperature indication signal TEMPn.

Each temperature sensing circuit (300-1 to 300-n) may include similar constituents and therefore only temperature sensing circuit 300-2 will be described in detail.

Temperature sensing circuit 300-2 may include variable resistors (310-2 and 320-2), a transistor P300-2, and an amplifier AMP300-2. Variable resistor 310-2 may have a first terminal connected to ground and a second terminal connected to a first terminal of variable resistor 320-2. Variable resistor 310-2 may receive temperature select signals TS1-k(2) which can be used to select the resistance value of variable resistor 310-2. Variable resistor 320-2 may have a second terminal connected to a positive input terminal of amplifier AMP300-2 and a drain of transistor P300-2 (node N1-2). Variable resistor 320-2 may receive hysteresis select signals HYS1-m(2) which can be used to select the resistance value of variable resistor 320-2. Variable resistor 320-2 may also receive temperature indication signal TEMP2. Transistor P300-2 may have a gate connected to receive voltage $V_{TEMP}$ and a source connected to a power supply voltage. Transistor P300-2 may be a p-channel IGFET, as just one example. Amplifier AMP300-2 may receive temperature independent reference voltage at a negative input terminal and may provide the temperature indication signal TEMP2 as an output.

Temperature sensing circuit 300-2 may operate in conjunction with bandgap reference input section 210 to detect when the semiconductor device 100 achieves a predetermined temperature essentially set by variable resistor 310-2. Variable resistor 320-2 then may provide hysteresis to reset temperature indication signal TEMP2 only after the temperature of the semiconductor device 100 drops a predetermined number of degrees below the predetermined temperature. This operation will now be described.

Referring now to FIG. 2, in bandgap reference input section 210, the feedback (via transistors P1 and P2) of amplifier AMP1 biases the second terminal of resistor R1 and the emitter of bipolar transistor Q1 to be essentially the same voltage. However, in a bandgap reference input section 210, it is known that the voltage across resistor R1 has a positive temperature characteristic in that VR1=(kT/q)×ln(n), where k is Boltzman's constant, q is electronic charge, and n is the junction area ratio of diode configured bipolar transistors Q2 to Q1. Thus, as temperature increases, current through resistor R1 must increase to provide the positive temperature characteristic. This is accomplished by increasing the current in transistor P2 by lowering the voltage $V_{TEMP}$.

FIG. 3(b) is a graph illustrating voltage-temperature characteristics of a temperature sensing circuit according to an embodiment. Referring now to FIG. 3(a), voltage $V_{TEMP}$ is received as an input to temperature sensing circuits 120. For example, temperature sensing circuit 300-2 receives voltage $V_{TEMP}$ at a gate terminal of transistor P300-2. As temperature increases, voltage $V_{TEMP}$ decreases and current increases In this way, the voltage at node N1-2 increases with temperature as illustrated in FIG. 3(b). When the voltage at node N1-2 is lower than the temperature independent reference voltage $V_{BGREF}$, amplifier AMP300-2 provides a low output as temperature indication signal TEMP2. Temperature indication signal TEMP2 may then be fed back to variable resistor 320-1. When temperature indication signal TEMP2 is low, variable resistor 320-2 is essentially shunted and therefore the voltage at node N1-2 is essentially determined by the current flowing through transistor P300-2 times the resistance value of variable resistor 310-2. As noted earlier, as temperature increases voltage $V_{TEMP}$ decreases and current through transistor P300-2 increases. When the voltage of node N1-2 intersects (at temperature T2 of FIG. 3(b)) with the temperature independent reference voltage $V_{BGREF}$, temperature indication signal TEMP2 may go from a low logic level to a high logic level to indicate that a predetermined temperature in accordance with a programmed value of variable resistor 310-2 has been reached.

When temperature indication signal TEMP2 goes high, the feedback mechanism to variable resistor 320-2 causes the shunt to be turned off and variable resistor 320-2 is then placed in the current path and the voltage of node N1-2 becomes the current through transistor P300-2 times the cumulative resistance values of both variable resistors (310-2 and 320-2). Thus, the voltage of node N1-2 becomes stepped up as indicated by the solid line of FIG. 3(b).

Then as temperature decreases, the voltage of node N1-2 may follow the dashed line illustrated in FIG. 3(b). In this way, temperature indication signal TEMP2 does not return to a low level until temperature T1 is reached. By doing so, temperature sensing circuit 300-2 has hysteresis to prevent any unnecessary toggling around a predetermined temperature such as temperature T2.

As noted earlier, temperature select signals TS1-$k$(2) may select a predetermined value for variable resistor (310-2) (i.e., the temperature setting resistor) to select the value of temperature T2. Hysteresis select signal HYS1-$m$(2) may select a predetermined value for variable resistor 320-2 (i.e. the hysteresis setting resistor) to select the temperature value of T2−T1.

Each temperature sensing circuit (300-1 to 300-$n$) may respectively receive a unique set of temperature setting signals (TS1-$k$) and a unique set of hysteresis setting signals HYS1-$m$. In this way, each temperature sensing circuit (300-1 to 300-$n$) may respond to a unique temperature T2 and have a unique value for the hysteresis (i.e., T2−T1).

Referring now to FIG. 4, a circuit schematic diagram of variable resistor for each temperature sensing circuit (320-1 to 320-$n$) according to an embodiment is set forth and given the general reference character 320-$j$. Variable resistor 320-$j$ may include resistors RH1 to RHm connected in series. Resistor RH1 may have a first terminal connected to node N1-$j$ (corresponding to a node N1-1 for temperature sensing circuit 300-1, a node N1-2 for temperature sensing circuit 300-2 and so on). Resistor RH1 may have a second terminal connected to a first terminal of resistor RH2. Resistor RH2 may have a second terminal connected to resistor RH3. This series connection may be repeated until the last resistor RHm may have a second terminal connected to a voltage divider node N2-$j$ (corresponding to a voltage dividing node N2-1 for temperature sensing circuit 300-1, a voltage dividing node N2-2 for temperature sensing circuit 300-2 and so on).

Variable resistor 320-$j$ may include transistors (N320-1$j$ to N320-$mj$) and transistor P320-$j$. Each transistor (N320-1$j$ to N320-$mj$) has a drain connected to a first terminal of a resistor (RH1 to RHm), respectively, and a source connected to a second terminal of a resistor (RH1 to RHm), respectively. Each transistor (N320-1$j$ to N320-$mj$) receives a respective hysteresis setting signal HYS1$j$ to HYSmj at a respective gate terminal. Transistor P320-$j$ has a source terminal connected to node N1-$j$, a drain terminal connected to voltage divider node N2-$j$ and receives temperature indication signal TEMPj at a gate.

Transistors (N320-1$j$ to N320-$mj$) may be n-channel IGFETs and transistor P320-$j$ may be a p-channel IGFET, for example.

Transistors (N320-1$j$ to N320-$mj$) can each form a shunt for a respective resistor RH1 to RHj when a respective hysteresis setting signal HYS1$j$ to HYSmj is at a high level (i.e. the respective transistor (N320-1$j$ to N320-$mj$) is turned on). When a respective hysteresis setting signal HYS1$j$ to HYSmj is at a low level, the respective transistor N320-1$j$ to N320-$mj$ is turned off and the respective resistor RH1 to RHm is included in the resistance value of variable resistor 320-$j$. In this way, a resistance value for variable resistor 320-$j$ may be selected. When temperature indication signal TEMPj is at a logic low level, transistor P320-$j$ is turned on and may provide a shunt for variable resistor 320-$j$. When temperature indication signal TEMPj is at a logic high level, transistor P320-$j$ is turned off and may not provide a shunt, thus a resistance of variable resistor 320-$j$ may include the cumulative values of resistors (RH1 to RHm) not shunted by respective transistors (N320-1 to N320-$j$).

Referring now to FIG. 5, a circuit schematic diagram of variable resistor for each temperature sensing circuit (320-1 to 320-$n$) according to an embodiment is set forth and given the general reference character 310-$j$. Variable resistor 310-$j$ may include resistors RT1 to RTm connected in series. Resistor RT1 may have a first terminal connected to voltage dividing node N2-$j$ (corresponding to a node N2-1 for temperature sensing circuit 300-1, a node N2-2 for temperature sensing circuit 300-2 and so on). Resistor RT1 may have a second terminal connected to a first terminal of resistor RT2. Resistor RT2 may have a second terminal connected to resistor RT3. This series connection may be repeated until the last resistor RTk may have a second terminal connected to ground.

Variable resistor 310-$j$ may include transistors (N310-1$j$ to N310-$kj$). Each transistor (N310-1$j$ to N310-$kj$) has a drain connected to a first terminal of a resistor (RT1 to RTk), respectively, and a source connected to a second terminal of a resistor (RT1 to RTk), respectively. Each transistor (N310-1$j$ to N310-$kj$) receives a respective temperature setting signal TS1$j$ to TSkj at a respective gate terminal.

Transistors (N310-1$j$ to N310-$kj$) may be n-channel IGFETs, for example.

Transistors (N310-1$j$ to N310-$kj$) can each form a shunt for a respective resistor RT1 to RTk when a respective temperature setting signal TS1$j$ to TSkj is at a high level (i.e., the respective transistor (N310-1$j$ to N310-$kj$) is turned on). When a respective temperature setting signal TS1$j$ to TSkj is at a low level, the respective transistor N310-1$j$ to N310-$kj$ is turned off and the respective resistor RT1 to RTk is included in the resistance value of variable resistor 310-$j$. In this way, a resistance value for variable resistor 310-$j$ may be selected. The resistance value for variable resistor 310-$j$ may include the cumulative values of resistors (RT1 to RTk) not shunted by respective transistors (N310-1 to N310-$j$).

Figure 6:
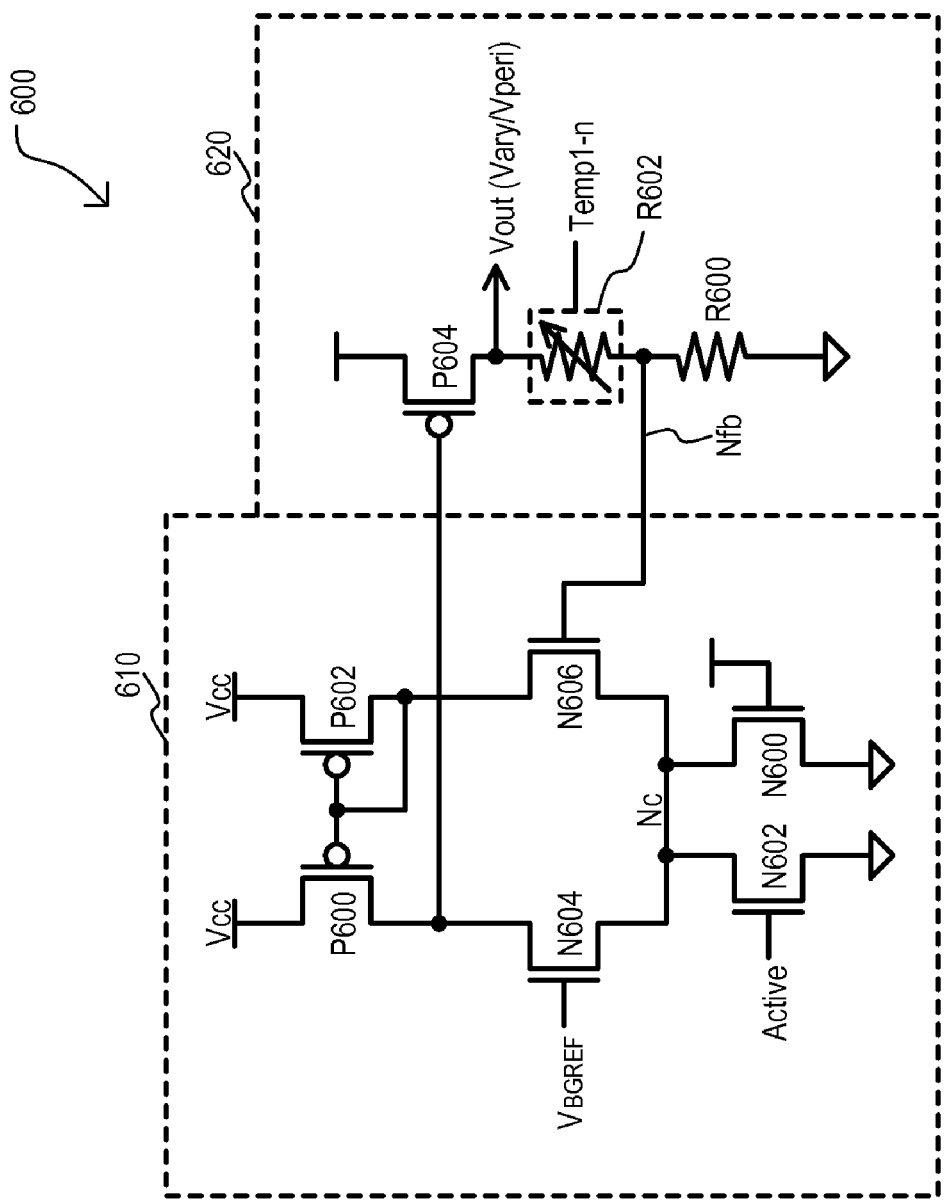
FIG. 6 is circuit schematic diagram of a voltage multiplier according to an embodiment.

Referring now to FIG. 6, a circuit schematic diagram of a voltage multiplier according to an embodiment is set forth and given the general reference character 600. Voltage multiplier 600 may be used as array voltage generator 118 or periphery voltage generator 122 in semiconductor device 100 of FIG. 1, as just two examples.

Voltage multiplier 600 may receive temperature independent reference voltage $V_{BGREF}$, temperature indication signals (TEMP1 to TEMPn), and an activation signal ACTIVE and may provide an output voltage Vout. Output voltage Vout may be essentially proportional to temperature independent reference voltage $V_{BGREF}$. Temperature independent reference voltage $V_{BGREF}$ may be multiplied by a factor in accordance with the values of temperature indication signals (TEMP1 to TEMPn) to provide output voltage Vout.

Voltage multiplier 600 includes a differential amplifier 610 and a driver circuit 620.

Differential amplifier 610 may include transistors (N600, N602, N604, N606, P600, and P602). Transistor N600 may have a source connected to ground, a drain connected to a common node Nc, and a gate connected to a power supply voltage. Transistor N602 may have a source connected to ground, a drain connected to a common node Nc, and a gate connected to receive an activation signal ACTIVE. Transistor N604 may have a source connected to common node Nc, a drain connected to commonly connected drain of transistor P600 and a gate of transistor P604 in driver circuit 620. Transistor N604 may receive the temperature independent reference voltage $V_{BGREF}$ at a gate. Transistor N606 may have a source connected to common node Nc, and a drain commonly connected to a drain and gate of transistor P602 and a gate of a transistor P600. Transistor 606 may have a gate connected to a feedback node Nfb of driver circuit 620. Transistors (P600 and P602) may each have a source connected to a power supply voltage. Transistors (N600, N602, N604, and N606) may be n-channel IGFETs and transistors (P600 and P602) may be p-channel IGFETs.

Driver circuit 620 may include transistor P604, resistor R600, and variable resistor R602. Transistor P604 may have a drain connected to output voltage Vout, a source connected to a power supply voltage, and a gate connected to commonly connected drains of transistors (P600 and N604). Variable resistor R602 may have a first terminal connected to output voltage Vout and a second terminal connected to a feedback node Nfb. Variable resistor R602 may receive temperature indication signals TEMP1-n. Resistor R600 may have a first terminal connected to feedback node Nfb and a second terminal connected to a ground.

The operation of voltage multiplier 600 will now be explained. As mentioned, voltage multiplier 600 may be used as array voltage generator 118 or periphery voltage generator 122 in semiconductor device 100 of FIG. 1, as just two examples. When used as array voltage generator 118, activation signal ACTIVE may correspond to activation signal Activate Varray and output voltage Vout may correspond to array voltage Vary. When used as periphery voltage generator 122, activation signal ACTIVE may correspond to activation signal Activate Vperi and output voltage Vout may correspond to periphery voltage Vperi. Activation signal Active may be high when semiconductor device 100 is in an active mode of operation in which current demands on internal power supplies such as a periphery voltage Vperi or array voltage Vary are relatively high. However, in a standby or low current mode, activation signal Active may be low. When activation signal Active is high, transistor N602 may be turned on and the response time of differential amplifier 610 may be improved.

Differential amplifier 610 receives the temperature independent reference voltage $V_{BGREF}$ at one input terminal (i.e., the gate of transistor N604 which forms the positive input terminal) and receives the feedback node Nfb at another input terminal (i.e., the gate of transistor N606 which forms the negative input terminal). In this way, the voltage at feedback node Nfb of driver circuit 620 may be forced to be essentially equal to the temperature independent reference voltage $V_{BGREF}$. By forcing the feedback node Nfb to be essentially equal to the temperature independent reference voltage, the voltage at output voltage Vout can be determined by the resistance values of variable resistor R602 and resistor R600, which form a voltage divider circuit. More specifically the voltage of output voltage can be the voltage of temperature independent reference voltage $V_{BGREF}$ times the sum of the resistance values of variable resistor R602 and resistor R600 divided by the resistance value of resistor R600. Thus, if resistor R600 has a resistance value of R1, and variable resistor R602 has a resistance value of R2, then Vout=$V_{BGREF}$(R1+R2)/R1.

By choosing the resistance value in accordance with temperature indication signals (TEMP1 to TEMPn), the voltage of output voltage Vout may be varied according to the temperature of semiconductor device 100. For example, it is well known that as temperature increases, due to decreased mobility, the drive current decreases in conventional IGFETs. Thus, as temperature increases variable resistor R602 may be increased in response to temperature indication signals (TEMP1 to TEMPn). By doing so, output voltage Vout may increase to compensate for the loss of performance of transistors as temperature increases. Similarly, as temperature decreases, the value of variable resistor R602 may decrease. In this way, the speed of circuitry in the peripheral circuits 128 and/or memory array 124 may be maintained at high temperatures while power may still be conserved at lower temperatures.

Also, as noted earlier, temperature indication signals (TEMP1 to TEMPn) may include hysteresis. In this way, voltage multiplier 600 may not have adverse affects of continuously changing the output voltage Vout when the operating temperature of semiconductor device 100 hovers around a threshold temperature set in a temperature sensing circuits (300-1 to 300-n).

Figure 7:
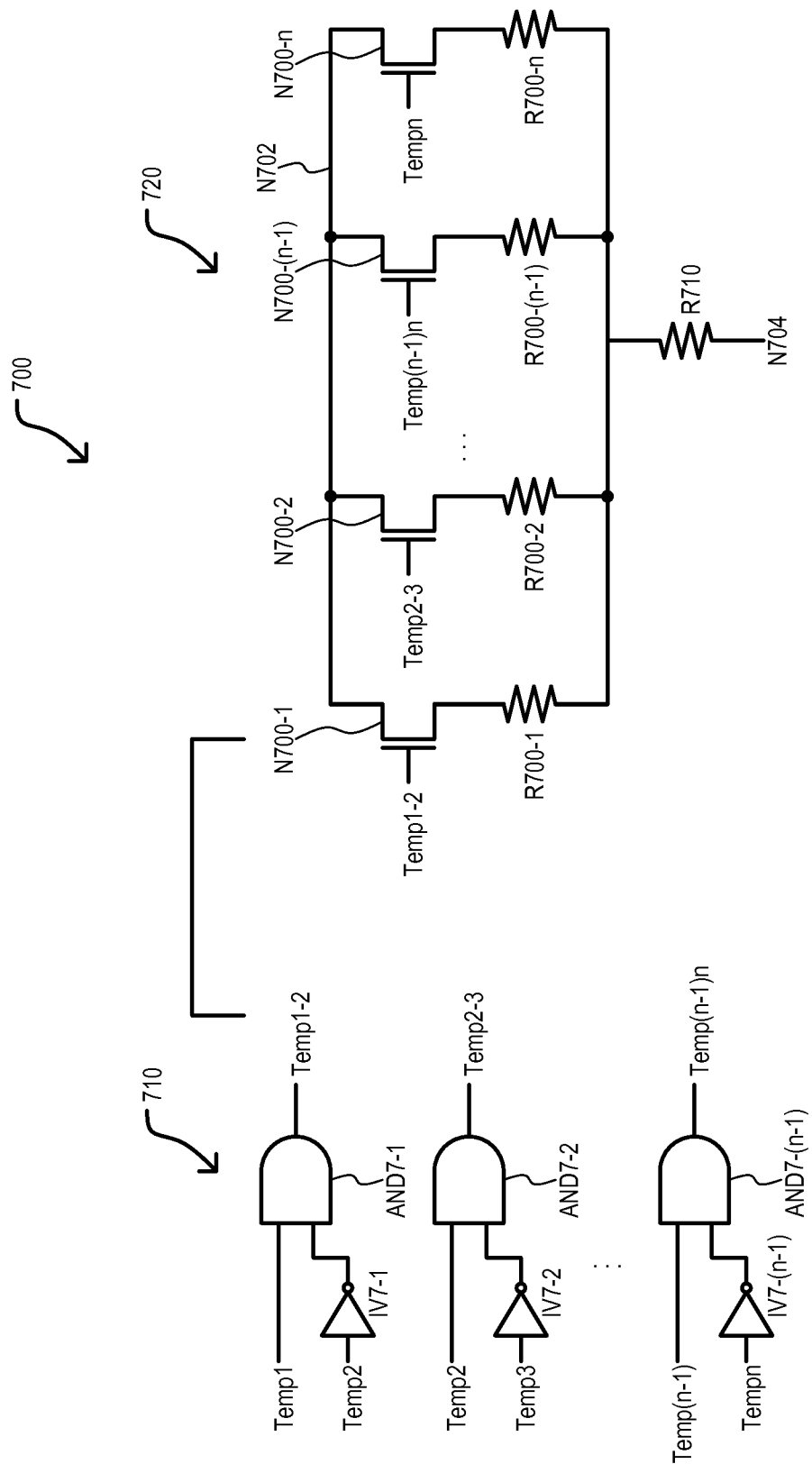
FIG. 7 is a circuit schematic diagram of a variable resistor according to an embodiment.

Referring now to FIG. 7, a circuit schematic diagram of a variable resistor according to an embodiment is set forth and given the general reference character 700. Variable resistor 700 may correspond to variable resistor R602 of FIG. 6. In this case, node N702 may correspond to output voltage node Vout and node N704 may correspond to feedback node Nfb.

Variable resistor 700 may include a resistance selection control section 710 and a resistance section 720. A resistance selection control section 710 may receive temperature indication signals (TEMP1 to TEMPn) and may provide temperature range signals (TEMP1-2, TEMP2-3, . . . , TEMP(n-1)n), where n corresponds to the number of temperature sensing circuits (300-1 to 300-n). Resistance section 720 may receive temperature range signals (TEMP1-2, TEMP2-3, . . . , TEMP(n-1)n) and highest order temperature indication signal TEMPn and select a total resistance value in accordance thereto.

Resistance selection control section 710 may include inverters (IV7-1, IV7-2, . . . IV7(n-1)) and AND gates (AND7-1, AND7-2, . . . AND7(n-1)), where n corresponds to the number of temperature sensing circuits (300-1 to 300-n). Inverter IV7-1 receives temperature indication signal TEMP2 as an input and provides an output as an input to AND gate AND7-1. AND gate AND7-1 receives temperature indication signal TEMP1 as another input and provides temperature range signal TEMP1-2 as an output. Inverter IV7-2 receives temperature indication signal TEMP3 as an input and provides an output as an input to AND gate AND7-2. AND gate AND7-2 receives temperature indication signal TEMP2 as another input and provides temperature range signal TEMP2-3 as an output. Such configured circuits may be repeated up to n-1 times with the last one having an inverter IV7-(n-1) that receives temperature indication signal TEMPn as an input and provides an output as an input to AND gate AND7-(n-1). AND gate AND7-(n-1) receives temperature indication signal TEMP(n-1) as another input and provides temperature range signal TEMP(n-1)n as an output.

Resistance section can include transistors (N700-1 to N700-n), resistors (R700-1 to R700-n), and resistor R710. Transistor N700-1 may have a drain connected to node N702, a source connected to a first terminal of resistor R700-1, and a gate connected to receive temperature range signal Temp1-2. Resistor R700-1 may have a second terminal connected to a first terminal of resistor R710. Transistor N700-2 may have a drain connected to node N702, a source connected to a first terminal of resistor R700-2, and a gate connected to receive temperature range signal Temp2-3. Resistor R700-2 may have a second terminal connected to a first terminal of resistor R710. Such transistor—resistor series connection between node N702 and the second terminal of resistor 710 may be continued to form n such circuits, where n is equal to the number of temperature sensing circuits (300-1 to 300-n). Resistor 710 may have a second terminal connected to node 704.

The operation of variable resistor 700 will now be explained.

Resistance selection control section 710 operates to provide one temperature range signal (Temp1-2 to Temp(n-1)n) being active at any given temperature. This may be accomplished by only activating a temperature range signal (Temp1-2 to Temp(n-1)n) if a lower temperature indication signal (Temp1 to Tempn) is active while the next successive temperature range signal (Temp1 to Tempn) is inactive (low). For example, if temperature indication signal Temp1 is high and temperature range signal Temp2 is low, this may indicate the temperature is between a temperature threshold level set by temperature sensing circuit 300-1 and a temperature set by temperature sensing circuit 300-2, for example. In this case, both inputs to AND gate AND7-1 are high and temperature range signal TEMP1-2 goes high. With temperature range signal TEMP1-2 high, transistor N700-1 in resistance section 720 may be turned on and resistor R700-1 may be included in a the overall resistance of variable resistor 700. Thus, the resistance value of variable resistor 700 would be the resistance value of resistor R710 and resistor R700-1.

By successively setting the threshold voltages of temperature sensing circuits (300-1 to 300-n), temperature control section can determine a temperature range in which semiconductor device 100 is operating and may select a resistance value for variable resistor 700 accordingly. By using resistor R710 to provide a minimum resistance value, the variable resistor 700 may be finely tuned by selecting one of resistors (R700-1 to R700-n) to provide an overall resistance value.

It should be noted that temperature sensing circuits (300-1 to 300-n) may be an independent set of temperature sensing circuits as opposed to other temperature sensing circuits if an independent temperature ranges are needed for selection of values of variable resistor 700. By using such a variable resistor 700 as a variable resistor R602 in a voltage multiplier circuit 600, internal power supply voltages used for example as an array voltage generator 118 or periphery voltage generator 122 may be varied in accordance with the temperature of the semiconductor device 100.

Figure 8B:
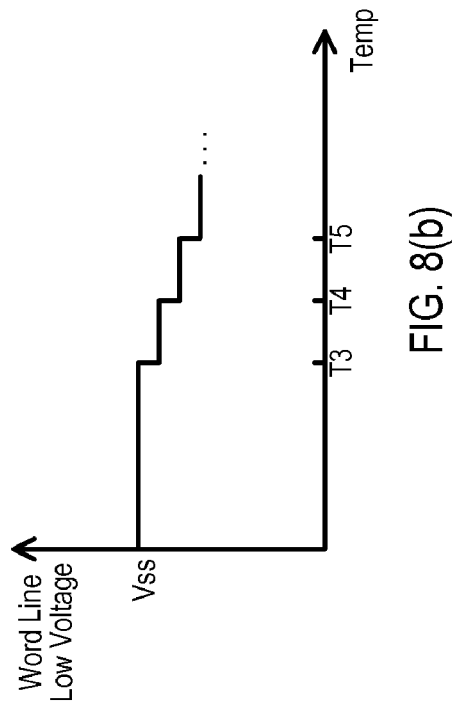
FIG. 8(b) is a graph illustrating a word line low voltage versus temperature according to an embodiment.
Figure 8A:
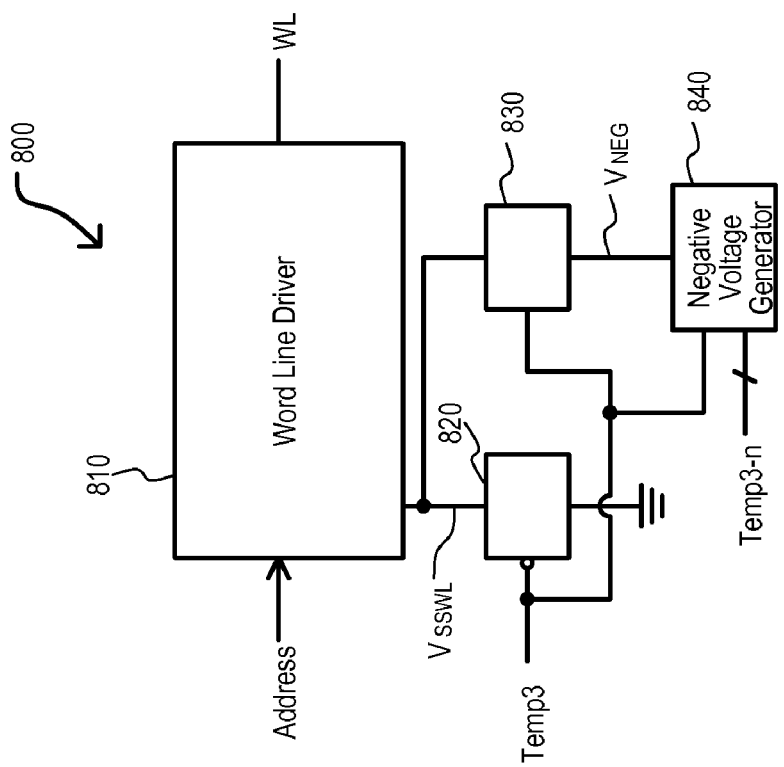
FIG. 8(a) is a block schematic diagram of a temperature independent word line driving circuit according to an embodiment.

Referring now to FIG. 8(a), a temperature dependent word line driving circuit according to an embodiment is set forth in a block schematic diagram and given the general reference character 800.

Temperature dependent word line driving circuit 800 can include a word line driver 810, selection circuits 820 and 830, and a negative voltage generator 840. Word line driver 810 may receive address signals Address and may select a word line WL in accordance with the address. Although only one word line WL is illustrated, a word line WL for each row of memory cells in a memory array is provided, however, only one word line WL in an array may be selected in accordance with a unique address Address value. A word line low voltage $V_{SSWL}$ may be provided from selection circuits (820 and 830) to word line driver 810. Selection circuit 820 may receive a temperature indication signal Temp3 at a selection enable input and may provide a ground voltage as the word line low voltage $V_{SSWL}$ when enabled. Selection circuit 830 may receive a temperature indication signal Temp3 at a selection enable input and may provide a negative voltage $V_{NEG}$ as the word line low voltage $V_{SSWL}$ when enabled. Negative voltage generator 840 may receive temperature indication signals (Temp3 to Tempn) as inputs and may provide a negative voltage $V_{NEG}$ that varies in accordance with the value of temperature indication signals (Temp3 to Tempn).

The operation of temperature dependent word line driving circuit 800 will now be described by referring to FIGS. 8(a) and 8(b). FIG. 8(b) is a graph showing a word line low voltage versus temperature according to an embodiment.

When the temperature of semiconductor device 100 is below a predetermined temperature (T3 set in temperature sensing circuit 300-3), selector circuit 820 provides a ground voltage (Vss) to the word line low voltage $V_{SSWL}$. However, once the temperature rises above T3, the selector circuit 820 is disabled and selector circuit 830 is enabled to pass a negative voltage $V_{NEG}$ provided by negative voltage generator 840 to be used as the word line low voltage $V_{SSWL}$. As temperature increases, temperature indication signals Temp3 to Tempn may control the negative voltage generator 840 to provide a more negative voltage, for example at temperatures T4 and T5, as negative voltage $V_{NEG}$. In this way, a memory cell (such as memory cell 900 in FIG. 9) connected to a word line WL may have reduced leakage.

It is understood that the word line low voltage may be provided as a word line disable logic level, in which a memory cell 900 may have a data node disconnected from a bit line.

Figure 9:
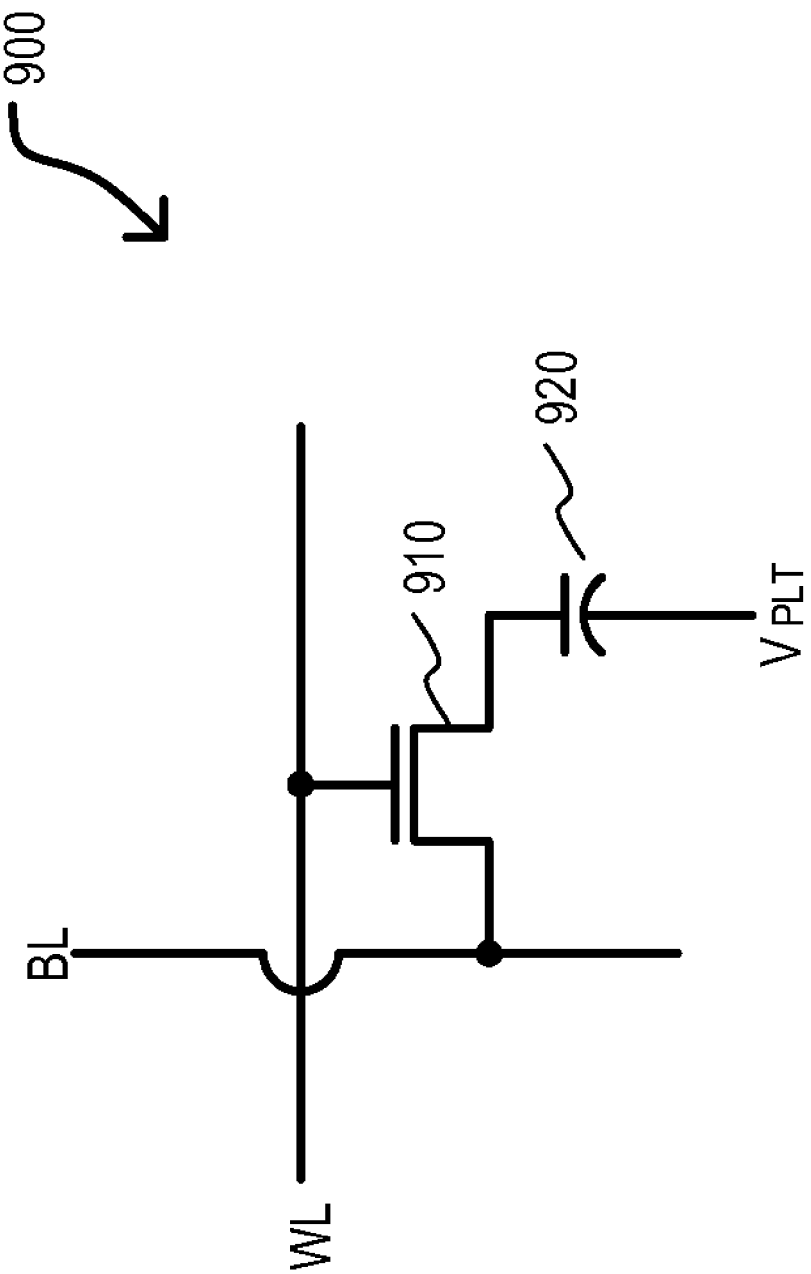
FIG. 9 is circuit schematic diagram of a dynamic random access memory (DRAM) cell.

Referring to FIG. 9, a DRAM memory cell is set forth in a circuit schematic diagram and given the general reference character 900. Memory cell 900 includes a pass transistor 910 and a capacitor 920. Pass transistor 910 receives the word line WL at a gate and may have a source connected to a first terminal of a capacitor 920 and a drain connected to a bit line BL. Capacitor 920 may have a second terminal connected to a plate voltage Vplt.

When the word line is at a word line low voltage $V_{SSWL}$, the pass transistor 910 is turned off. In this state, it is desirable that the charge leakage through pass transistor 910 be minimized. By providing a word line low voltage $V_{SSWL}$ that varies with temperature (becomes more negative as temperature increases), temperature dependent word line driving circuit 800 may reduce charge leakage through pass transistor 910 even when the temperature of semiconductor device 100 increases. This may reduce refresh time and improve operating characteristics of semiconductor device 100 and may even increase a temperature range at which semiconductor device 100 can reliably operate.

As temperature increases, the charge stored on a capacitor (capacitor 920 of FIG. 9) degrades more quickly due to increased leakage current. Thus, refresh must be performed more frequently. Typically, refresh frequency is designed for the worst-case temperature. However in such a conventional case, at low temperatures the memory cells may be refreshed much more frequently than necessary and power in standby modes may be wasted.

Figure 10A:
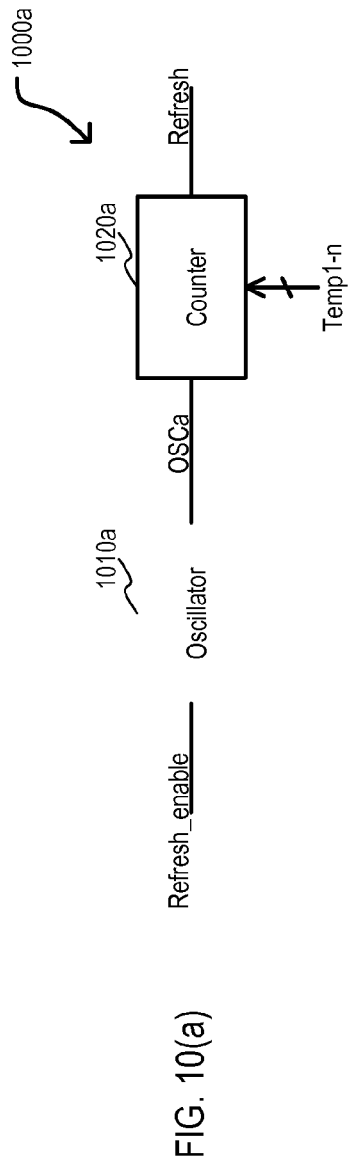
FIGS. 10(a) and 10(b) block schematic diagrams of refresh timing circuits according to embodiments.
Figure 10B:
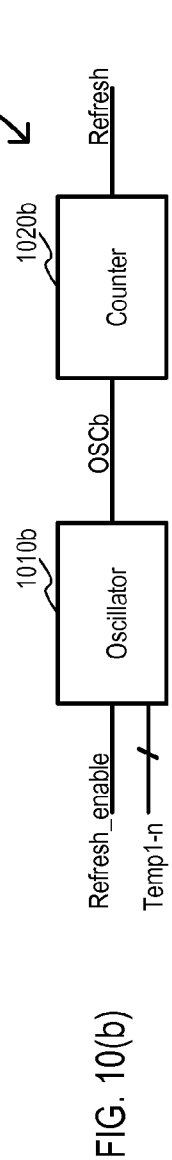

Referring now to FIG. 10(a), a refresh timing circuit according to an embodiment is set forth in a block schematic diagram and given the general reference character 1000a. Refresh timing circuit 1000a may include an oscillator circuit 1010a and a counter circuit 1020a. Oscillator circuit 1010a may receive a refresh enable signal Refresh_enable and may provide an oscillation signal OSCa to counter circuit 1020a. Counter circuit 1020a may receive temperature indication signals (Temp1 to Tempn) and may provide a refresh signal Refresh as an output.

The operation of refresh timing circuit 1000a will now be described in conjunction with FIGS. 10(*a*), 10(*c*), and 10(*d*). FIG. 10(*d*) is a timing diagram illustrating the operation of refresh timing circuits 10(*a*) and 10(*b*). When refresh enable signal Refresh_enable is in a disable state, oscillator circuit 1010a is disabled and oscillation signal OSCa is held low. When semiconductor device 100 enters a self refresh mode, refresh enable signal Refresh_enable becomes an enable state (logic high, for example). When refresh enable signal Refresh_enable becomes an enable state, oscillator circuit 1010a becomes enabled and provides an oscillation signal OSCa (a periodic square wave) to counter circuit 1020a. Counter circuit 1020a counts the number of oscillation signals OSCa (i.e., the number of times oscillation signal OSCa transitions from a low level to a high level) and provides a refresh signal Refresh having a pulsed output when the counter circuit 1020a reaches a predetermined count value. When refresh signal Refresh pulses high, a row of memory cells in memory array 124 are refreshed.

Figure 10C:
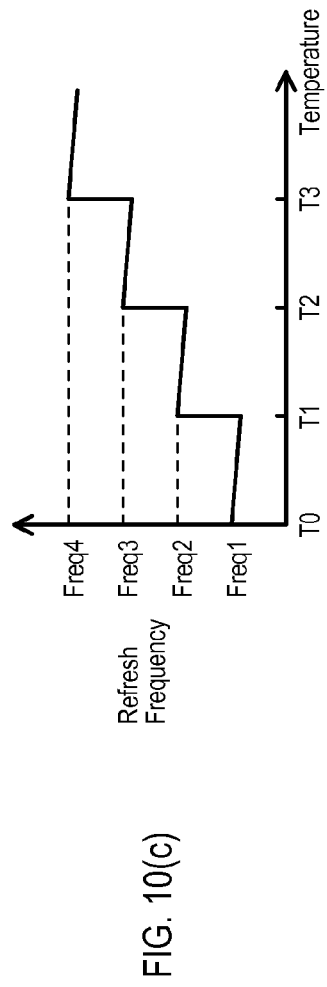
FIG. 10(c) is a graph illustrating refresh frequency versus temperature of a refresh timing circuit according to an embodiment.
Figure 10D:
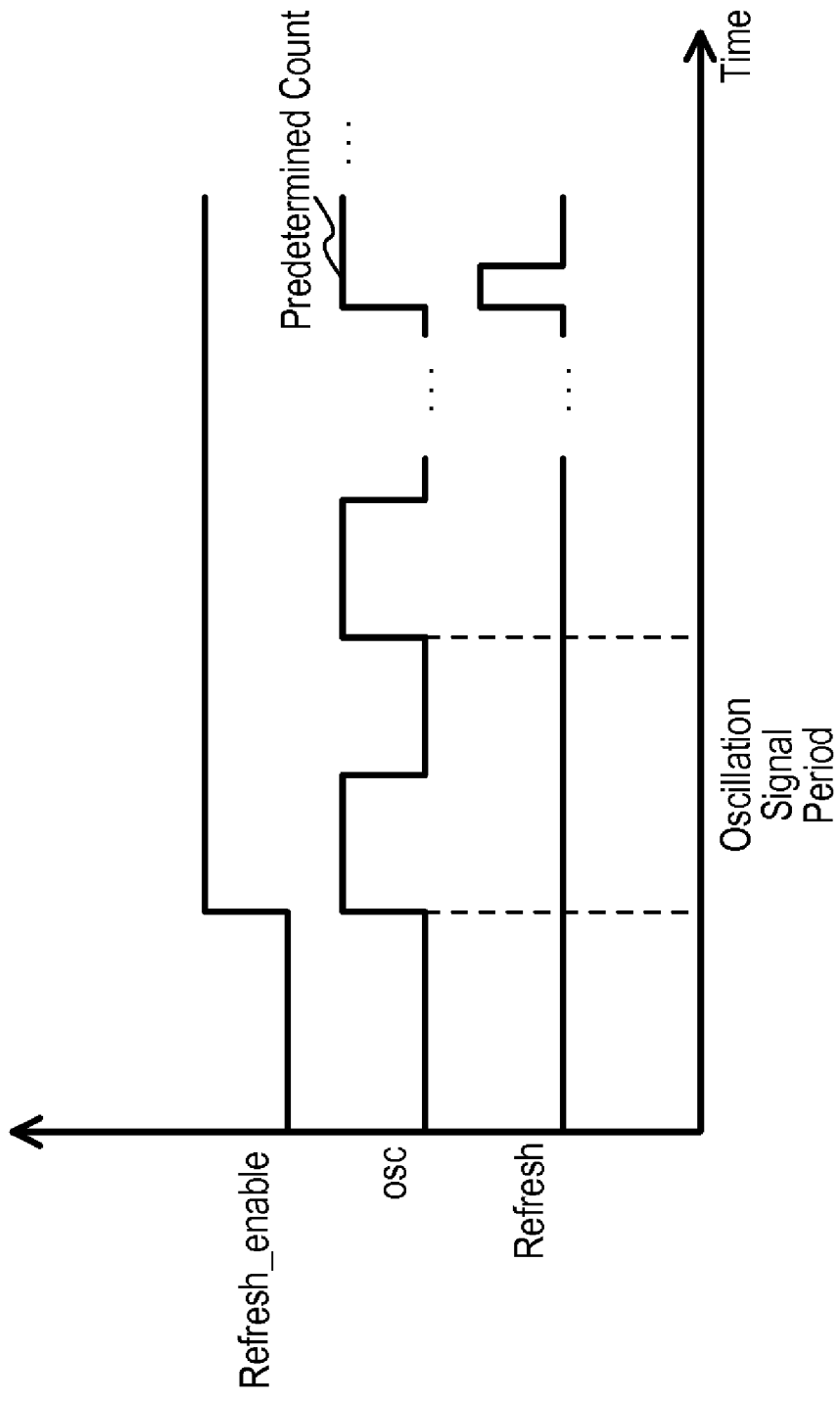
FIG. 10(d) is a timing diagram illustrating the operation of refresh timing circuits according to an embodiment.

The frequency of the refresh signal is determined by the frequency of oscillation signal OSCa and the predetermined count value in counter 1020a. It is noted that the frequency of oscillation signal OSCa may decrease as temperature increases due to the degradation of transistor current characteristics. However, it is desirable that the refresh frequency increases to compensate for increased charge leakage from memory cell 900. Temperature indication signals (Temp1 to Tempn) are provided to counter circuit 1020a to change the predetermined count value in accordance with the temperature of the semiconductor device 100. This is illustrated in FIG. 10(*c*). FIG. 10(C) is a diagram illustrating how the refresh frequency changes with temperature. When temperature indication signals (Temp1 to Tempn) indicate that the temperature of semiconductor device 100 is at temperature T0, less than temperature T1, counter circuit 1020a may have a first predetermined count value to provide a refresh frequency freq1. As temperature increases, the refresh frequency may slowly decrease due to the frequency of oscillation signal OSCa decreasing. When temperature indication signals (Temp1 to Tempn) indicate that the temperature of semiconductor device 100 is greater than temperature T1 and less than temperature T2, counter circuit 1020a may have a second predetermined count value to provide a refresh frequency freq2 greater than frequency freq1, wherein the second predetermined count value is less than the first predetermined count value. Once again as the temperature increases above temperature T1, the refresh frequency may slowly decrease due to the frequency of oscillation signal OSCa decreasing. When temperature indication signals (Temp1 to Tempn) indicate that the temperature of semiconductor device 100 is greater than temperature T2 and less than temperature T3, counter circuit 1020a may have a third predetermined count value to provide a refresh frequency freq3 greater than frequency freq2, wherein the third predetermined count value is less than the second predetermined count value. Once again as the temperature increases above temperature T2, the refresh frequency may slowly decrease due to the frequency of oscillation signal OSCa decreasing. When temperature indication signals (Temp1 to Tempn) indicate that the temperature of semiconductor device 100 is greater than temperature T3 counter circuit 1020a may have a fourth predetermined count value to provide a refresh frequency freq4 greater than frequency freq3, wherein the fourth predetermined count value is less than the third predetermined count value.

In this way, as temperature increases, the frequency of refresh in a self-refresh mode of operation may increase to compensate for degraded charge leakage from a memory cell 900. Furthermore, by varying the frequency of refresh in this manner, low temperature current consumption may be reduced because frequency of refresh does not need to be set for the worst case (high temperature).

Referring now to FIG. 10(*b*), a refresh timing circuit according to an embodiment is set forth in a block schematic diagram and given the general reference character 1000b. Refresh timing circuit 1000b may include an oscillator circuit 1010b and a counter circuit 1020b. Oscillator circuit 1010b may receive a refresh enable signal Refresh_enable and temperature indication signals (Temp1 to Tempn) and may provide an oscillation signal OSCa to counter circuit 1020b. Counter circuit 1020b may provide a refresh signal Refresh as an output.

The operation of refresh timing circuit 1000b will now be described in conjunction with FIGS. 10(*b*), 10(*c*), and 10(*d*). When refresh enable signal Refresh_enable is in a disable state, oscillator circuit 1010b is disabled and oscillation signal OSCb is held low. When semiconductor device 100 enters a self refresh mode refresh enable signal Refresh_enable becomes an enable state (logic high, for example). When refresh enable signal Refresh_enable becomes an enable state, oscillator circuit 1010b becomes enabled and provides an oscillation signal OSCb (a periodic square wave) to counter circuit 1020b. Counter circuit 1020b counts the number of oscillation signals OSCb (i.e. the number of times oscillation signal OSCb transitions from a low level to a high level) and provides a refresh signal Refresh having a pulsed output when the counter circuit 1020b reaches a predetermined count value. When refresh signal Refresh pulses high, a row of memory cells in memory array 124 are refreshed.

The frequency of the refresh signal is determined by the frequency of oscillation signal OSCb and the predetermined count value in counter 1020b. It is noted that the frequency of oscillation signal OSCb may decrease as temperature increases due to the degradation of transistor current characteristics. However, it is desirable that the refresh frequency increases to compensate for increased charge leakage from memory cell 900. Temperature indication signals (Temp1 to Tempn) are provided to oscillation circuit 1010b to change the base frequency of oscillation signal OSCb in accordance with the temperature of the semiconductor device 100. This is illustrated in FIG. 10(*c*). FIG. 10(*c*) is a diagram illustrating how the refresh frequency changes with temperature. When temperature indication signals (Temp1 to Tempn) indicate that the temperature of semiconductor device 100 is at temperature T0, less than temperature T1, oscillation circuit 1010b may have a first predetermined base frequency to provide a refresh frequency freq1. As temperature increases, the refresh frequency may slowly decrease due to the frequency of oscillation signal OSCb decreasing. When temperature indication signals (Temp1 to Tempn) indicate that the temperature of semiconductor device 100 is greater than temperature T1 and less than temperature T2, oscillation circuit 1010b may have a second predetermined base frequency to provide a refresh frequency freq2 greater than frequency freq1, wherein the second predetermined base frequency is greater than the first predetermined base frequency. Once again as the temperature increases above temperature T1, the refresh frequency may slowly decrease due to the frequency of oscillation signal OSCb decreasing. When temperature indication signals (Temp1 to Tempn) indicate that the temperature of semiconductor device 100 is greater than temperature T1 and less than temperature T2, oscillation circuit 1010b may have a third predetermined base frequency to provide a refresh frequency freq3 greater than frequency freq2, wherein the third predetermined base frequency is greater than the second predetermined base frequency. Once again as the temperature increases above temperature T2, the refresh frequency may slowly decrease due to the frequency of oscillation signal OSCa decreasing. When temperature indication signals (Temp1 to Tempn) indicate that the temperature of semiconductor device 100 is greater than temperature T3, oscillation circuit 1010b may have a fourth predetermined base frequency to provide a refresh frequency freq4 greater than frequency freq3, wherein the fourth predetermined base frequency is greater than the third predetermined base frequency.

In this way, as temperature increases, the frequency of refresh in a self-refresh mode of operation may increase to compensate for degraded charge leakage from a memory cell 900. Furthermore, by varying the frequency of refresh in this manner, low temperature current consumption may be reduced because frequency of refresh does not need to be set for the worst case (high temperature).

It is noted that the temperature indication signals (Temp1 to Tempn) provided to refresh timing circuits (1000a and 1000b) can have temperature values that can be set by a user and may include hysteresis that can be set by a user as previously described. By doing so, refresh frequency may not intermittently change when semiconductor device 100 hovers around a predetermined threshold temperature of a temperature sensing circuit (300-1 to 300-n).

Figure 11B:
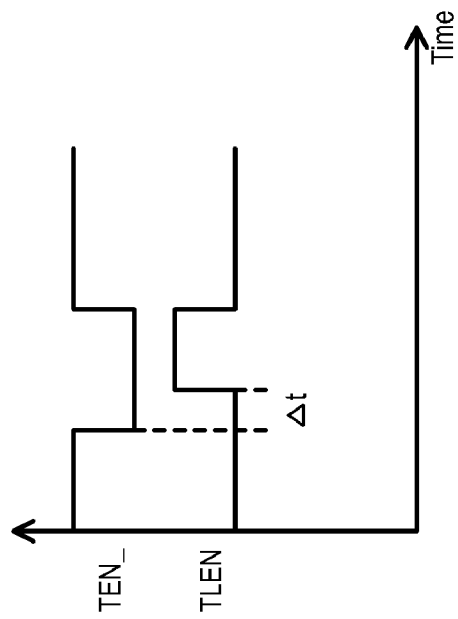
FIG. 11(b) is a timing diagram illustrating the operation of the temperature detector circuit of FIG. 11(a) according to an embodiment.
Figure 11A:
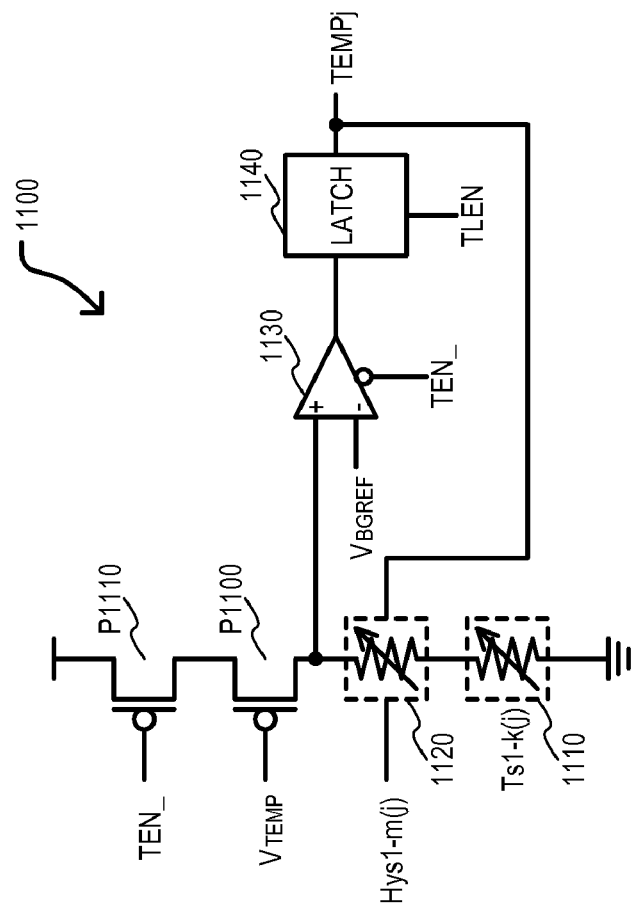
FIG. 11(a) is a circuit schematic diagram of a temperature sensing circuit according to an embodiment.

Referring now to FIG. 11(a), a circuit schematic diagram for a temperature sensing circuit according to an embodiment is set forth and given the general reference character 1100. Temperature sensing circuit 1100 may be used to replace each of temperature sensing circuits (300-1 to 300-n) in FIG. 3a.

Temperature sensing circuit 1100 may include variable resistors (1110 and 1120), transistors (P1100 and P1110), amplifier 1130, and latch circuit 1140. Transistor P1110 may have a source connected to a power supply, a drain connected to the source of transistor P1100, and a gate connected to receive a temperature detect enable signal TEN_. Transistor P1100 may have a drain connected to a first terminal of variable resistor 1120 and a positive input to amplifier 1130 and may have a gate connected to receive voltage $V_{TEMP}$. Variable resistor 1120 may have a second terminal connected to a first terminal of variable resistor 1110. Variable resistor 1120 may receive hysteresis select signals HYS1-$m(j)$ which can be used to select the resistance value of variable resistor 1120. Variable resistor 1120 may also receive temperature indication signal TEMPj. Variable resistor 1110 may have a second terminal connected to ground. Variable resistor 1110 may receive temperature select signals TS1-$k(j)$ which can be used to select the resistance value of variable resistor 1110. Amplifier 1130 may receive temperature independent reference voltage $V_{BGREF}$ at a negative input terminal and temperature detect enable signal TEN_ and may provide an output to latch circuit 1140. Latch circuit 1140 may receive temperature latch enable signal TLEN and may provide temperature indication signal TEMPj as an output.

Variable resistors 1120 may be essentially the same as variable resistor 320-$j$ illustrated in FIG. 4. Variable resistor 1110 may be essentially the same as variable resistor 310-$j$ illustrated in FIG. 5.

Temperature sensing circuit 1110 may operate in essentially the same manner as temperature sensing circuit 300-2 of FIG. 3(a), except temperature sensing circuit 1110 is enabled by temperature detect enable signal TEN_ and the temperature indication signal TEMPj is latched into latch circuit 1140 in response to temperature latch enable signal TLEN.

FIG. 11(b) is a timing diagram illustrating the timing of temperature detect enable signal TEN_ and temperature latch enable signal TLEN when semiconductor circuit 100 performs a temperature detection operation. When no temperature detection operation is currently being performed, temperature detect enable signal TEN_ is high (a temperature detection disable state) and temperature latch enable signal is low (a latch disable state). With temperature detect enable signal TEN_ high, transistor P1110 is turned off and amplifier 1130 is turned off so that essentially no current is consumed by temperature detect circuit 1100. With temperature latch enable low, latch circuit maintains a previously detected temperature indication signal value from a previous temperature detection operation. When a temperature detection operation is performed, temperature detect enable signal TEN_ pulses low. With temperature detect enable signal TEN_ low, transistor P1110 is turned on and amplifier circuit 1130 is turned on and temperature is detected in a similar manner as explained with regard to temperature detection circuit 320-2 above. After a time delay Δt, temperature latch enable signal TLEN pulses high and the output of amplifier circuit 1130 is proved by latch 1140 as temperature indication signal TEMPj. Time delay Δt is selected to ensure sufficient time for temperature detection circuit 1100 to properly detect the temperature without unwanted glitches. Subsequently, temperature detect enable signal TEN_ returns to a high level to turn off transistor P1110 and disable amplifier 1130 and temperature latch enable signal TLEN returns low and latch circuit 1140 maintains the temperature indication signal TEMPj until the next temperature detection operation is performed.

In this way, temperature detection may be performed at intervals determined by the user and temperature sensing circuits 1100 may only consume power during the detection and overall power consumption of semiconductor device 100 may be reduced.

Temperature sensing circuit 1100 maintains essentially the same temperature response with hysteresis as illustrated in FIG. 3(b). Also, a user may select the temperature threshold and hysteresis amount by providing hysteresis select signals HYS1-$m(j)$ and temperature select signals TS1-$k(j)$ in the same manner as described above.

The above embodiments illustrate a case where multiple parameters may be modified according by sharing the same temperature sensing circuits (300-1 to 300-$n$ or 1100). Such multiple parameters include an array voltage Vary, a peripheral circuit voltage Vperi, refresh timing signal Refresh, and a low voltage $V_{SSWL}$ for driving a word line WL. However, each of these parameters may need to be independently tuned with respect to temperature. Such an embodiment will now be described.

Figure 12:
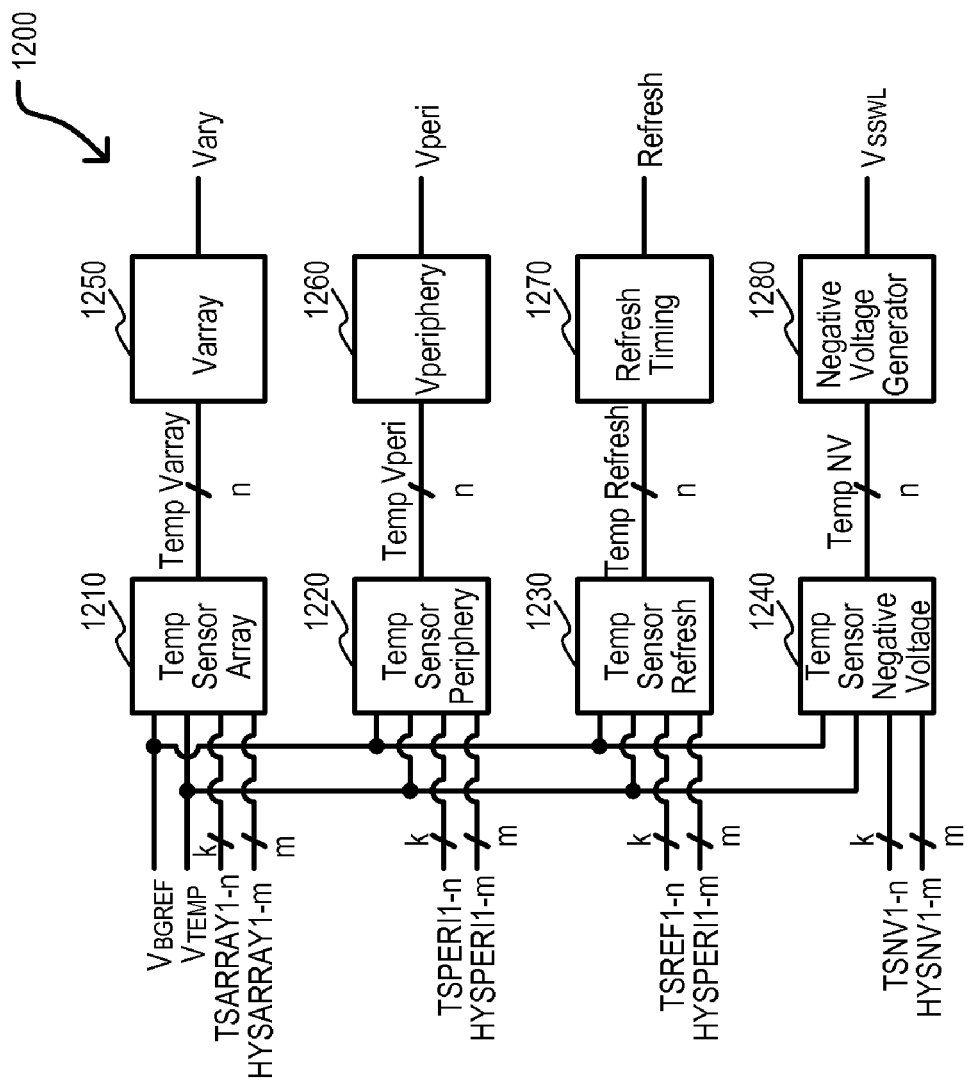
FIG. 12 is a block schematic diagram of a temperature dependent parameter setting scheme according to an embodiment.

Referring now to FIG. 12, a temperature dependent parameter setting scheme according to an embodiment is set forth in a block schematic diagram and given the general reference character 1200. Temperature dependent parameter setting scheme 1200 may be incorporated into a semiconductor device, such as semiconductor device 100 in FIG. 1. Such a semiconductor device may be a DRAM, as just one example.

Temperature dependent parameter setting scheme 1200 may include array temperature sensing circuits 1210, periphery temperature sensing circuits 1220, refresh temperature sensing circuits 1230, negative voltage temperature sensing circuits 1240, an array voltage generator 1250, a periphery voltage generator 1260, a refresh timing circuit 1270 and a negative voltage generator 1280.

Array temperature sensing circuits 1210 may receive temperature independent reference voltage $V_{BGREF}$, reference voltage $V_{TEMP}$, array temperature select signals TSARRY1-$k$, array hysteresis setting signals HYSARRAY1-$m$ and may provide array temperature indication signals Temp Varray. Array voltage generator 1250 may receive array temperature indication signals Temp Varray and may provide an array voltage Vary.

Periphery temperature sensing circuitss 1220 may receive temperature independent reference voltage $V_{BGREF}$, reference voltage $V_{TEMP}$, periphery temperature select signals TSPERI1-$k$, periphery hysteresis setting signals HYSPERI1-$m$ and may provide array temperature indication signals Temp Vperi. Periphery voltage generator 1260 may receive periphery temperature indication signals Temp Vperi and may provide a periphery voltage Vperi.

Refresh temperature sensing circuits 1230 may receive temperature independent reference voltage $V_{BGREF}$, reference voltage $V_{TEMP}$, refresh temperature select signals TSREF1-$k$, refresh hysteresis setting signals HYSREF1-$m$ and may provide refresh temperature indication signals Temp Refresh. Refresh timing circuit 1270 may receive refresh temperature indication signals Temp Refresh and may provide refresh signal Refresh.

Negative voltage temperature sensing circuits 1240 may receive temperature independent reference voltage $V_{BGREF}$, reference voltage $V_{TEMP}$, negative voltage temperature select signals TSNV1-$k$, negative voltage hysteresis setting signals HYSNV1-$m$ and may provide negative voltage temperature indication signals Temp NV. Negative voltage generator 1280 may receive negative voltage temperature indication signals Temp NV and may provide a word line low voltage $V_{SSWL}$.

Temperature sensing circuits (1210, 1220, 1230, and 1240) may correspond to temperature sensing circuits (300-1 to 300-$n$ and/or 1100). However, each of array temperature sensing circuits 1210, periphery temperature sensing circuits 1220, refresh temperature sensing circuits 1230, and negative voltage temperature sensing circuits 1240 may be a separate group of temperature sensing circuits. In this way, an array voltage generator 1250, a periphery voltage generator 1260, a refresh timing circuit 1270 and a negative voltage generator 1280 may be independently controlled having individually programmed temperature threshold voltage in which parameters, such as voltage levels and timings may be set. Each group of temperature sensing circuits (1210, 1220, 1230, and 1240) may have independently set temperature thresholds (by setting a resistance value of a resistor such as variable resistor 310-$j$) in accordance with temperature setting signals (TSARRAY1-$k$, TSPERI1-$k$, TSREF1-$k$, and TSREF1-$k$). Likewise, each group of temperature sensing circuits (1210, 1220, 1230, and 1240) may have independently set temperature hysteresis values (by setting a resistance value of a resistor such as variable resistor 320-$j$) in accordance with hysteresis setting signals (HYSARRAY1-$m$, HYSPERI1-$m$, HYSREF1-$m$, and HYSREF1-$m$).

By using temperature dependent parameter setting scheme 1200, a semiconductor device 100 may be more finely tuned and may operate more optimally over a wide temperature range.

Although temperature dependent parameter setting scheme shows each group of temperature sensing circuits (1210, 1220, 1230, and 1240) includes n temperature sensing circuits controlled by k temperature select signals (TSArray1-$k$, TSPERI1-$k$, TSREF1-$k$, and TSNV1-$k$) and m hysteresis select signals (HYSArray1-$m$, HYSPERI1-$n$, HYSREF1-$m$, and HYSNV1-$m$) to each provide n temperature indication signals (Temp Varry, Temp Vperi, Temp Refresh, and Temp NV), each group of temperature sensing circuits (1210, 1220, 1230, and 1240) may include any independent number of termperature sensing circuits and any independent number of temperature select and hysteresis select signals according to design goals.

Figure 13:
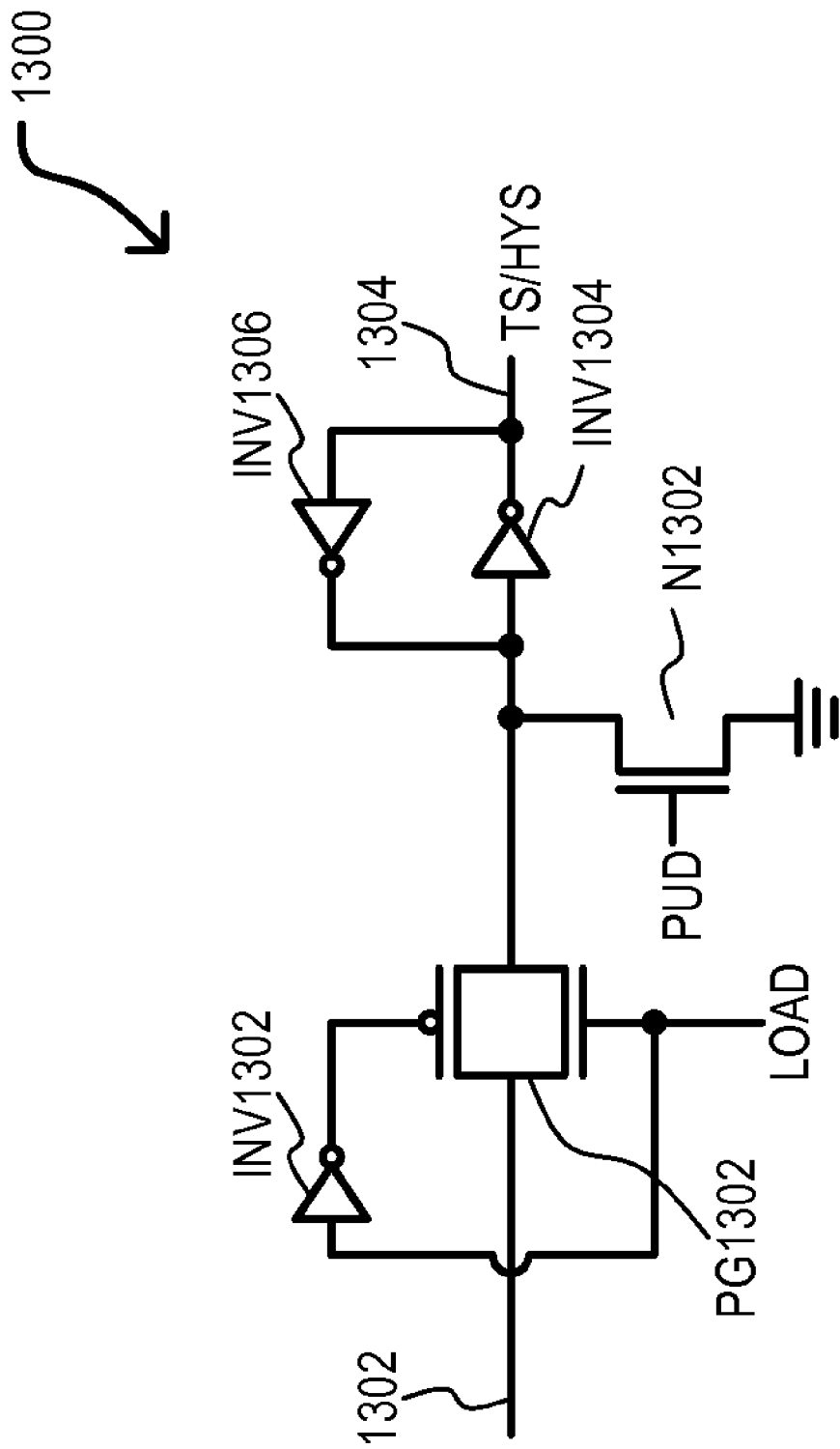
FIG. 13 is a circuit schematic diagram of a select register circuit according to an embodiment.

Referring now to FIG. 13, a circuit schematic diagram of a select register circuit according to an embodiment is set forth and given the general reference character 1300. Select register circuit 1300 may be used for temperature select registers 114 and hysteresis select registers 116 of FIG. 1. For each temperature sensing circuit (300-1 to 300-$n$ or 1100), there may be k select register circuits 1300 used for temperature select registers 114 and there may be m select register circuits 1300 used for hysteresis select registers 116.

Select register circuit 1300 may include inverters (INV1302, INV1304, and INV1306), pass gate PG1302, and transistor N1302. Pass gate PG1302 may receive an input 1302 at an input terminal and a load signal Load at a control input and may provide an output to an input of inverter INV1304. Inverter INV1302 may receive load signal Load and may provide an output to another control input terminal of pass gate PG1302. Transistor N1302 may have a source connected to ground, a drain connected to the input of inverter INV1304, and a gate connected to receive a power up detect signal PUD. Inverter INV1304 may provide an output to a terminal 1304. Inverter INV1306 may have an input connected to terminal 1304 and an output connected to the imputer of inverter INV1304 to form a latch.

The operation of select register circuit 1300 will now be discussed. When a load operation occurs, such as a load operation for any of the sets of select registers used as temperature select registers 114 or hysteresis select registers 116, load signal Load pulses high. The load signal Load can correspond to either the temperature select load signal TSL or hysteresis select load signal HysL. When load signal Load pulses high, the logic value at input node 1302 is passed through pass gate PG1302 to be latched in cross-coupled inverters (INV1306 and INV1304) and provided as a select signal at output terminal 1304. The select signal may be either a temperature select signal TS or a hysteresis select signal HYS, depending on whether select register circuit 1300 is used as a temperature select register or hysteresis select register, respectively. It is noted that input 1302 may receive a logic value from one of input buffers 112. When load signal returns to a low logic level, pass gate PG1302 is turned off and the value remains latched in cross-coupled inverters (INV1304 and INV1306). Transistor N1302 is provided to supply a known default value in select register on power up of semiconductor device 100. When power up occurs, power up detect signal PUD pulses high, thus turning on transistor N1302 to provide a low logic level input to inverter INV1304. In this way, select signals (TS or HYS) may be powered up to a known state.

Figure 15:
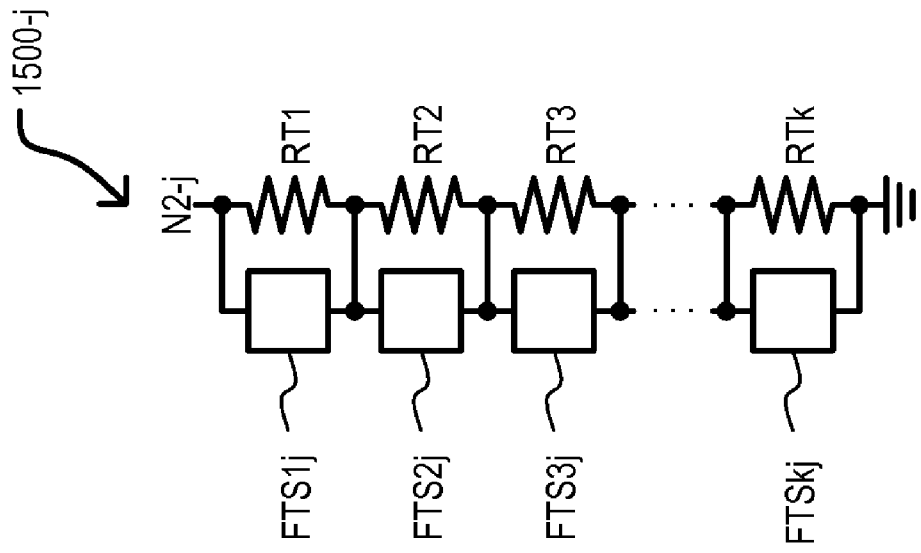
FIG. 15 is a circuit schematic diagram of a variable resistor according to an embodiment.

In yet another embodiment, instead of providing hyteresis setting signals HYS1-$m$ or temperature setting signals TS1-$k$ to select temperature thresholds and hysteresis temperature values to temperature sensing circuits (300-1 to 300-n or 1100), a manufacturer may select resistance values of variable resistors (310-j, 320-j, 1110, and 1120) during manufacture. This may be done for example, with fuses or a metal mask, for example. Such examples are illustrated in FIGS. 14 and 15.

Figure 14:
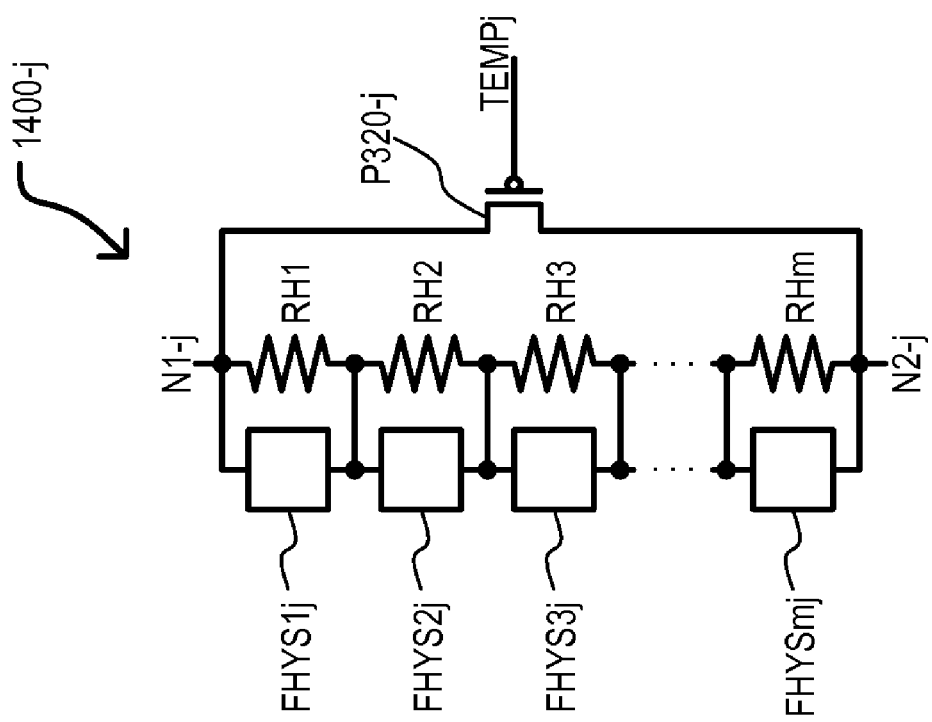
FIG. 14 is a circuit schematic diagram of a variable resistor according to an embodiment.

Referring now to FIG. 14, a circuit schematic diagram of variable resistor for each temperature sensing circuit according to an embodiment is set forth and given the general reference character 1400-j. Variable resistor 1400-j may be used as variable resistor 320-j or 1120, for example. Variable resistor 1400-j may include resistors RH1 to RHm connected in series. Resistor RH1 may have a first terminal connected to node N1-j (corresponding to a node N1-1 for temperature sensing circuit 300-1, a node N1-2 for temperature sensing circuit 300-2 and so on). Resistor RH1 may have a second terminal connected to a first terminal of resistor RH2. Resistor RH2 may have a second terminal connected to resistor RH3. This series connection may be repeated until the last resistor RHm may have a second terminal connected to a voltage divider node N2-j (corresponding to a voltage dividing node N2-1 for temperature sensing circuit 300-1, a voltage dividing node N2-2 for temperature sensing circuit 300-2 and so on).

Variable resistor 1400-j may include programmable links (FHYS1j to FHYS mj) and transistor P320-j. Each programmable link (FHYS1j to FHYS mj) has a first terminal connected to a first terminal of a resistor (RH1 to RHm), respectively, and a second terminal connected to a second terminal of a resistor (RH1 to RHm), respectively. Transistor P320-j has a source terminal connected to node N1-j, a drain terminal connected to voltage divider node N2-j and receives temperature indication signal TEMPj at a gate.

Programmable links (FHYS1j to FHYS mj) may be fuses, such as polysilicon fuses or metal options, for example.

Programmable links (FHYS1j to FHYSmj) can each form a shunt for a respective resistor. For example, an unblown fuse or a programmed in metal option may form a shunt, while a blown fuse or a programmed out metal option may form an open circuit, such that the respective resistor RH1 to RHm is included or omitted in the resistance value of variable resistor 320-j. In this way, a resistance value for variable resistor 1400-j may be selected. When temperature indication signal TEMPj is at a logic low level, transistor P320-j is turned on and may provide a shunt for variable resistor 1400-j. When temperature indication signal TEMPj is at a logic high level, transistor P320-j is turned off and variable resistor 1400-j may include the cumulative values of resistors (RH1 to RHm) not shunted by respective programmable links (FHYS1j to FHYSmj).

Referring now to FIG. 15, a circuit schematic diagram of variable resistor for each temperature sensing circuit according to an embodiment is set forth and given the general reference character 1500-j. Variable resistor 1500-j may be used as variable resistor 310-j or 1110, for example. Variable resistor 1500-j may include resistors RT1 to RTk connected in series. Resistor RT1 may have a first terminal connected to voltage dividing node N2-j (corresponding to a node N2-1 for temperature sensing circuit 300-1, a node N2-2 for temperature sensing circuit 300-2 and so on). Resistor RT1 may have a second terminal connected to a first terminal of resistor RT2. Resistor RT2 may have a second terminal connected to resistor RT3. This series connection may be repeated until the last resistor RTn may have a second terminal connected to ground.

Variable resistor 1500-j may include programmable links (FTS1j to FTSkj). Each programmable link (FTS1j to FTSkj) has a first terminal connected to a first terminal of a resistor (RT1 to RTk), respectively, and a second terminal connected to a second terminal of a resistor (RT1 to RTn), respectively.

Programmable links (FTS1j to FTSkj) may be fuses, such as polysilicon fuses or metal options, for example.

Programmable links (FTS1j to FTSkj) can each form a shunt for a respective resistor RT1 to RTk. For example, an unblown fuse or a programmed in metal option may form a shunt, while a blown fuse or a programmed out metal option may form an open circuit, such that the respective resistor (RT1 to RTk) is included in the resistance value of variable resistor 1500-j. In this way, a resistance value for variable resistor 1500-j may be selected. The resistance value for variable resistor 1500-j may include the cumulative values of resistors (RT1 to RTk) not shunted by respective programmable links (FTS1j to FTSkj).

By incorporating the variable resistors (1400-j and 1500-j) in the embodiments, a manufacturer may perform temperature characteristic tests of semiconductor device 100 and select the values of variable resistors (1400-j and 1500-j) at a back end to provide accurate temperature threshold values and temperature hysteresis values in temperature sensing circuits even when there are process variations.

Now a method of the testing temperature sensing circuits to find the values of the temperature thresholds and the hysteresis temperatures will be discussed.

As noted, the refresh frequency of semiconductor device 100 may be increases as temperature increases to compensate for increased charge leakage from memory cells. The method of testing described below places the semiconductor device 100 in a self-refresh mode of operation and monitors the current consumed by semiconductor device over a temperature range to detect temperature threshold values and hysteresis temperature values of the temperature sensing circuits.

Figure 16:
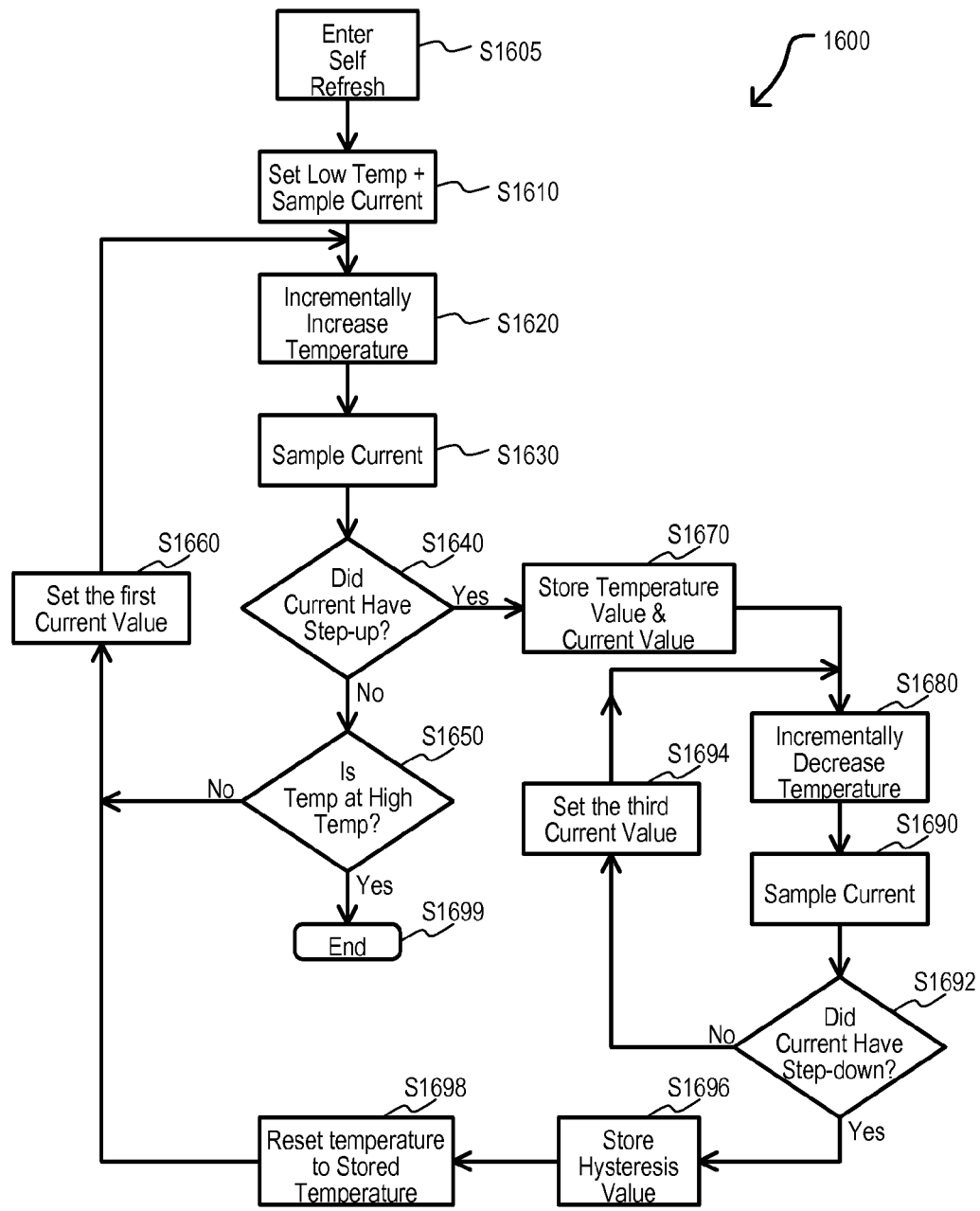
FIG. 16 is a flow diagram of a method of testing temperature sensing circuits of a semiconductor device according to an embodiment.

Referring now to FIG. 16, a flow diagram of a method of testing the temperature sensing circuits of a semiconductor device according to an embodiment is set forth and given the general reference character 1600.

In a step 1605, the semiconductor device 100 is placed in a self-refresh mode of operation and then a temperature of the device is set to an initial low temperature value (step 1610) and the average current consumption of the semiconductor device 100 is sampled to provide a first current value. The initial low temperature value can be the minimum value of the temperature range in which the semiconductor device 100 is to be tested. The temperature can then be incrementally increased (step 1620). In a next step 1630, the average current consumption of the semiconductor device 100 is sampled to provide a second current value.

In a next step 1640, the first current value is compared to the second current value and a determination is made as to whether there was a "step-up" in current. A "step-up" in current is when the current through semiconductor device 100 makes an increase that can be indicative of an increase in the self-refresh frequency caused in response to a temperature sensing circuit having a temperature indication signal change states to incrementally increase the refresh frequency. If there is no "step-up" in current, the test method goes to step S1650. If a "step-up" in current is detected, the test method goes to step 1670.

In step 1650, the temperature value is checked against a high temperature value. The high temperature value can be the maximum value of the temperature range in which the semiconductor device 100 is to be tested. If the high temperature value has been reached, the test in ended at step S1699. If the maximum temperature value has not been reached, the test method goes to step S1660.

In step S1660, the last sampled current of step 1630 becomes the first current value and the test method returns to step S1620.

As mentioned in step S1640, if there is a "step-up" in current, the test method goes to step S1670. This "step-up" in current indicates that a temperature threshold value was reached. In step S1670, the temperature value is stored and the current value is stored as a third current value. The temperature value can be stored as a temperature at which a temperature sensing circuit has a temperature threshold value set. The test method then proceeds to step S1680, where the temperature is incrementally decreased.

In a next step S1690, the average current consumed by semiconductor device 100 is sampled and provided as a fourth current value. In a next step S1692, the third current value is compared to the fourth current value and a determination is made as to whether there was a "step-down" in current. A "step-down" in current is when the current through semiconductor device 100 makes a decrease that can only be indicative of a decrease in the self-refresh frequency caused in response to a temperature sensing circuit having a temperature indication signal change states to incrementally decrease the refresh frequency. If there is no "step-down" in current, the test method goes to step S1694. If a "step-down" in current is detected, the test method goes to step S1696.

In step S1694, the last average current sampled (i.e. the fourth current value) at step S1690 is set as the third current value and the test method returns to step S1680.

When a "step-down" in current is detected, step S1696 determines the hysteresis value by subtracting the current temperature value from the last temperature value stored at step S1670. This temperature value can be stored as a value at which a temperature sensing circuit has a hysteresis temperature value set.

Next at step S1698, the temperature is reset to the last temperature value stored in step S1670 and the test method returns to step S1660.

Although the test method is performed by incrementing the temperature from a first temperature (a low end temperature) to a second temperature (a high end temperature), the test method may be implemented by starting at a second temperature (a high end temperature) and repeatedly decrementing the temperature to a first temperature (a low end temperature) to detect the temperature threshold values and temperature hysteresis values.

The test method 1600 of FIG. 16 may be performed when the semiconductor device 100 is integrally contained on a silicon wafer with a plurality of like semiconductor devices. This may be performed by placing the silicon wafer on a temperature chuck to accurately provide the temperature to the semiconductor device.

Alternatively, the test method 1600 of FIG. 16 may be performed after the semiconductor device 100 is packaged. In this case, an ambient temperature may be provided in a chamber setting.

Figure 17:
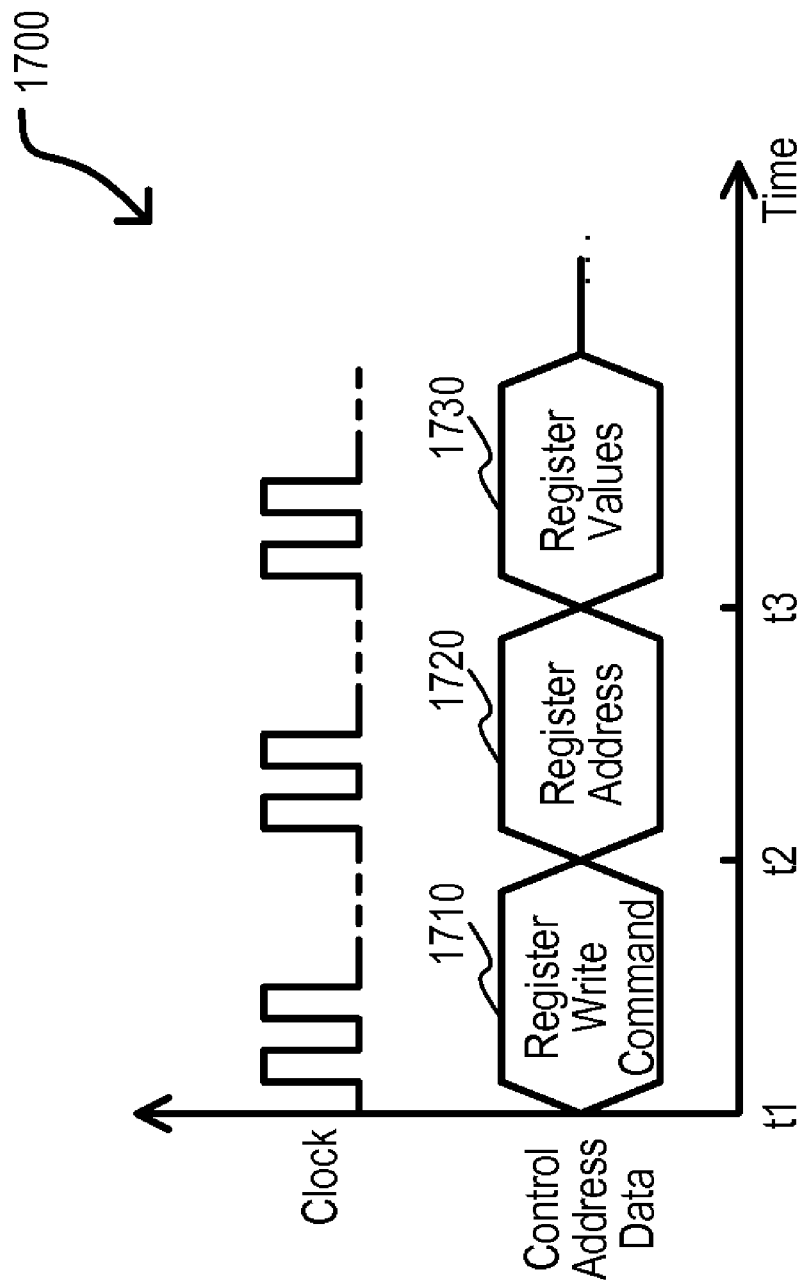
FIG. 17 is a timing diagram illustrating a method of writing values to temperature select registers and hysteresis select registers according to an embodiment.

Referring now to FIG. 17, a timing diagram illustrating a method of writing values to temperature select registers and hysteresis select registers according to an embodiment is set forth and given the general reference character 1700.

It is noted that semiconductor device 100 may operate synchronously with a system clock Clock and may be a synchronous DRAM.

At a first time t1, a register write command 1710 may be provided to semiconductor device 100. The register write command 1710 may notify semiconductor device 100 that registers, such as temperature select registers 114 or hysteresis select registers 116 are to have values written. The register write command 1710 may be in packet form, in that in a first clock cycle, first predetermined values may be received at control, address, and or data pins, at a second clock cycle a second predetermined values may be received at control, address, and or data pins, and so on. Then, at a time t2, a register address 1720 may be provided to semiconductor device 100. A register address 1720 may identify a set of temperature select registers 114 or hysteresis select registers 116 to have values written. The register address 1720 may also be provided in packet form (i.e. serially and synchronously with clock clock). Then, at time t3, register values 1730 may be provided to semiconductor device 100. Likewise, register values 1730 may be provided in packet form. Register values 1730 may be written in a set of temperature select registers 114 or hysteresis select registers 116 identified by register address 1720.

Although the embodiments illustrate using a bandgap reference generator circuit to provide reference voltages ($V_{BGREF}$ and $V_{TEMP}$) to temperature sensing circuits 120 and to various voltage generators (118 and 122) for on chip supplies. The temperature sensing circuits 120 may receive reference voltages generated independently from reference voltages provided to the voltage generators (118 and 122).

Although the embodiments illustrate a semiconductor device 100 that is a DRAM. Other semiconductor devices may benefit from the invention. For example, semiconductor device 100 may be a static random access memory (SRAM) and word line driver 138 or 810 may drive a word line for selecting an SRAM cell. An SRAM cell may include n-type IGFETs forming pass transistors to data stored in a cross-coupled inverter type memory cell.

Semiconductor device 100 may also be a non-volatile memory, such as a FLASH memory device using floating gate memory cells, for example. In this case, a variable resistor (such as variable resistors 320-j, 310-j, 1400, and/or 1500) may have resistance values selected by a programmed non-volatile memory cells, for example.

Semiconductor device 100 may have temperature values periodically read by a controller, or the like. These temperature values may be used to control a cooling device, such as a fan, or the like. In this case, in a system including a plurality of semiconductor devices, each semiconductor device may have a respective cooling device that may be controllable in accordance with the actual temperature of the respective semiconductor device. By doing so, a cooling device, which may have a high current draw when turned on, may be optimally used such that overall current consumption may be reduced. Furthermore, the cooling device, such as a fan, may have different speeds, such that when a semiconductor device has a lower temperature, the cooling device may have a slower speed. When the semiconductor device has a higher temperature, the cooling device may have a higher speed. In this way, the cooling device may only draw a larger current when it is critically necessary to rapidly cool the semiconductor device. By doing so, overall current consumption may be reduced.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method of testing a dynamic random-access memory (DRAM) device, the method comprising:

measuring an output of a temperature-sensing circuit of the DRAM device, wherein the temperature-sensing circuit is configured to provide a first temperature indication, and wherein the temperature-sensing circuit includes a temperature threshold value and a hysteresis temperature value;

incrementally changing a temperature of the DRAM device until the output of the temperature-sensing circuit changes from a first state to a second state at a first temperature;

associating the temperature threshold value with the first temperature;

incrementally changing the temperature of the DRAM device until the output of the temperature-sensing circuit changes from the second state to a third state at a second temperature; and associating the hysteresis temperature value with the second temperature.

2. The method of claim 1, wherein the second temperature is lower than the first temperature.

3. The method of claim 1, wherein said measuring an output of a temperature-sensing circuit comprises measuring a current of the output of the temperature-sensing circuit.

4. The method of claim 3, wherein the current measurement is an average current measurement.

5. The method of claim 1, wherein the temperature-sensing circuit is configured to control a refresh timing of the DRAM device.

6. The method of claim 5, further comprising associating the first temperature with a first performance characteristic of the DRAM device.

7. The method of claim 6, further comprising associating the second temperature with a second performance characteristic of the DRAM device.

8. The method of claim 5, further comprising measuring a current draw of the DRAM device.

9. The method of claim 1, wherein the temperature threshold value is associated with a temperature threshold resistance.

10. The method of claim 1, wherein the hysteresis temperature value is associated with a hysteresis temperature resistance.

11. The method of claim 1, further comprising changing the temperature threshold value.

12. The method of claim 1, further comprising changing the hysteresis temperature value.

13. The method of claim 1, wherein the temperature-sensing circuit further comprises:
an amplifier including a positive input and a negative input;
a transistor electrically connected to the positive input, wherein the transistor is configured to be controlled by a temperature signal; and
a temperature threshold resistance and a hysteresis resistance electrically connected in series to the positive input, wherein the hysteresis resistance is configured to be controlled, at least in part, by an output of the amplifier.

14. The method of claim 13, wherein the threshold resistance comprises a variable resistance.

15. The method of claim 13, wherein the hysteresis resistance comprises a variable resistance.

16. The method of claim 13, wherein the threshold resistance and the hysteresis resistance are programmable.

17. A method of testing a dynamic random-access memory (DRAM) device, the method comprising:
placing the DRAM device in a mode of operation;
measuring a power consumption of the DRAM device, wherein the DRAM device includes a temperature-sensing circuit configured to provide a first temperature indication, and wherein the temperature-sensing circuit comprises a temperature threshold value and a hysteresis temperature value;
incrementally changing a temperature of the DRAM device until the power consumption of the DRAM device changes from a first state to a second state at a first temperature;
associating the temperature threshold value with the first temperature;
incrementally changing the temperature of the DRAM device until the power consumption of the DRAM device changes from the second state to a third state at a second temperature; and
associating the hysteresis temperature value with the second temperature.

18. The method of claim 17, wherein the second temperature is lower than the first temperature.

19. The method of claim 17, wherein said measuring a power consumption of the DRAM device comprises measuring a current of the DRAM device.

20. The method of claim 19, wherein the current measurement is an average current measurement.

21. The method of claim 17, wherein the temperature-sensing circuit is configured to control a refresh timing of the DRAM device.

22. The method of claim 17, further comprising associating the first temperature with a first performance characteristic of the DRAM device.

23. The method of claim 22, further comprising associating the second temperature with a second performance characteristic of the DRAM device.

24. The method of claim 17, wherein the temperature threshold value is associated with a temperature threshold resistance.

25. The method of claim 17, wherein the hysteresis temperature value is associated with a hysteresis temperature resistance.

26. The method of claim 17, further comprising changing the temperature threshold value.

27. The method of claim 17, further comprising changing the hysteresis temperature value.

28. The method of claim 17, wherein the temperature-sensing circuit further comprises:
an amplifier including a positive input and a negative input;
a transistor electrically connected to the positive input, wherein the transistor is configured to be controlled by a temperature signal; and
a temperature threshold resistance and a hysteresis resistance electrically connected in series to the positive input, wherein the hysteresis resistance is configured to be controlled, at least in part, by an output of the amplifier.

29. The method of claim 28, wherein the threshold resistance comprises a variable resistance.

30. The method of claim 28, wherein the hysteresis resistance comprises a variable resistance.

31. The method of claim 28, wherein the threshold resistance and the hysteresis resistance are programmable.

* * * * *

UNITED STATES PATENT AND TRADEMARK OFFICE
CERTIFICATE OF CORRECTION

| | | |
|---|---|---|
| PATENT NO. | : 7,953,573 B2 | Page 1 of 1 |
| APPLICATION NO. | : 12/753411 | |
| DATED | : May 31, 2011 | |
| INVENTOR(S) | : Walker | |

It is certified that error appears in the above-identified patent and that said Letters Patent is hereby corrected as shown below:

Column 1, line 5, below Title insert -- CROSS-REFERENCE TO RELATED APPLICATIONS --.

Signed and Sealed this
Fourth Day of October, 2011

David J. Kappos
*Director of the United States Patent and Trademark Office*